(12) United States Patent
Fujisawa

(10) Patent No.: US 8,609,468 B2
(45) Date of Patent: Dec. 17, 2013

(54) SEMICONDUCTOR DEVICE AND METHOD OF MANUFACTURING THE SAME

(75) Inventor: Atsushi Fujisawa, Nanae (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/442,190

(22) Filed: Apr. 9, 2012

(65) Prior Publication Data

US 2012/0267772 A1    Oct. 25, 2012

(30) Foreign Application Priority Data

Apr. 21, 2011   (JP) .................................. 2011-095457

(51) Int. Cl.
*H01L 21/50*    (2006.01)

(52) U.S. Cl.
USPC ........... 438/123; 438/106; 438/111; 257/666; 257/676

(58) Field of Classification Search
USPC .................. 438/106, 111, 123; 257/666, 676, 257/E23.052, E21.502
See application file for complete search history.

(56) References Cited

U.S. PATENT DOCUMENTS

| 7,019,388 B2 | 3/2006 | Ito et al. |
| 8,129,222 B2 * | 3/2012 | Tan et al. ...................... 438/118 |
| 8,373,258 B2 * | 2/2013 | Mizusaki et al. ............. 257/676 |

FOREIGN PATENT DOCUMENTS

JP         2004-214233 A    7/2004

* cited by examiner

*Primary Examiner* — Theresa T Doan
(74) *Attorney, Agent, or Firm* — Mattingly & Malur, PC

(57) ABSTRACT

To provide a semiconductor device having suspension leads with less distortion. In QFN having a plurality of external terminal portions at the periphery of the bottom surface of a sealing body, a plurality of leads is linked to a plurality of long suspension leads of the QFN at an intermediate portion thereof or at between the intermediate portion and a position near the die pad. These long suspension leads are each supported by these leads, making it possible to suppress distortion of each of the suspension leads in a wire bonding step or molding step in the fabrication of the QFN.

15 Claims, 27 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2011-095457 filed on Apr. 21, 2011 including the specification, drawings and abstract is incorporated herein by reference in its entirety.

BACKGROUND

The present invention relates to a semiconductor device and a manufacturing technology thereof, in particular, to a technology effective when applied to a peripheral type semiconductor device having a plurality of leads (external terminals) at the periphery thereof.

In the manufacture of a QFN (quad flat non-leaded package) type semiconductor device, there is disclosed a technology of molding and thereby forming a resin sealing body for sealing a semiconductor chip therewith and then cutting the peripheral portion of the resin sealing body and a lead frame simultaneously along a cut line located inside of a line (mold line) running along the outer edge of the resin sealing body.

[Patent Document 1]
Japanese Patent Laid-Open No. 2004-214233

SUMMARY

In a QFN type semiconductor device, a plurality of leads serving as external terminals are arranged at the periphery of the semiconductor device in a plan view. When external dimensions of a semiconductor chip to be installed in a semiconductor device are considerably smaller than the external dimensions of a chip mounting portion (die pad) by which the semiconductor chip and leads are electrically connected with each other via wires and on which the semiconductor chip is to be mounted, the length of the wires increases, depending on the external dimensions of the semiconductor chip.

The present inventors therefore studied a decrease in the external dimensions of a chip mounting portion (die pad) and an increase in the length of each lead (shortening the distance between the end portion of the lead and the semiconductor chip) in order to reduce the wire length.

Increasing the length of each lead (decreasing the external dimensions of the die pad) however leads to an increase in the length of a suspension lead for supporting the chip mounting portion (die pad) on which the semiconductor chip is to be mounted.

In recent years, with the advanced functions of a semiconductor device, an amount of heat generated by a semiconductor chip tends to increase. Therefore, there is also a demand for improving the heat dissipation properties (reducing heat resistance) of a semiconductor device. The present inventors have also studied a structure of exposing a chip mounting portion from a sealing body in order to improve the heat dissipation properties of a semiconductor device, but have found that increasing the length of a suspension lead as described above however causes deflection of the suspension lead when it expands (particularly, expands along an extending direction of the suspension lead) due to the influence of heat. Deflection of a suspension lead may cause various problems in manufacturing steps of a semiconductor device.

With the foregoing problem in view, the invention has been made. An object of the invention is to provide a technology capable of suppressing deflection of a suspension lead.

Another object of the invention is to provide a technology capable of manufacturing a semiconductor device having improved reliability.

The above and the other objects and novel features of the invention will be apparent from the description herein and accompanying drawings.

Inventions typical among the inventions disclosed herein will next be outlined briefly.

A method of manufacturing a semiconductor device according to a typical embodiment has the following steps: (a) providing a lead frame having a die pad, a plurality of suspension leads, a plurality of first leads, and a plurality of second leads; (b) mounting a semiconductor chip on the die pad such that the rear surface of the semiconductor chip faces to the upper surface of the die pad; (c) electrically connecting a plurality of bonding pads with the plurality of first leads via a plurality of wires, respectively; and (d) clamping, with a first molding die and a second molding die, a portion of the plurality of suspension leads, a portion of the plurality of first leads, and a portion of the plurality of second leads which the lead frame with the semiconductor chip thereon has and supplying a resin in a cavity portion formed by the molding dies, and thereby forming a sealing body such that the lower surface of the die pad, the portion of the plurality of suspension leads, the portion of the plurality of first leads, and the portion of the plurality of second leads are exposed. The plurality of suspension leads each extend from the die pad to a plurality of corner portions of the sealing body, in the plan view, and the plurality of suspension leads each have one end portion connected to the die pad, the other end portion opposite to the one end portion, and an intermediate portion located between the one end portion and the other end portion. Some of the second leads are connected at the intermediate portion of each of the suspension leads, or at the die pad side of each of the suspension leads from the intermediate portion.

A method of manufacturing a semiconductor device according to another embodiment has the following steps: (a) providing a lead frame having a die pad, a plurality of suspension leads, a plurality of first leads, and a plurality of second leads, (b) mounting a semiconductor chip on the die pad such that the rear surface of the semiconductor chip faces to the upper surface of the die pad, (c) clamping a portion of the plurality of suspension leads, a portion of the plurality of first leads, and a portion of the plurality of second leads with a jig and a stage to electrically connect the plurality of bonding pads with the plurality of first leads via a plurality of wires, respectively, and (d) forming a sealing body such that the lower surface of the die pad, a portion of the plurality of suspension leads, a portion of the plurality of first leads, and a portion of the plurality of second leads are exposed from the sealing body. Furthermore, the suspension leads each extend from the die pad to a plurality of corner portions of the sealing body, in the plan view. The plurality of suspension leads each have one end portion connected to the die pad, the other end portion located opposite to the one end portion, and an intermediate portion located between the one end portion and the other end portion. Some of the second leads are connected at the intermediate portion of each of the suspension leads, or at the die pad side of each of the suspension leads from the intermediate portion.

A semiconductor device according to a typical embodiment has a die pad, a plurality of suspension leads, a plurality of first leads arranged adjacent to the die pad, a plurality of second leads which support the suspension leads, a semiconductor chip having a plurality of bonding pads on the front surface thereof and mounted on the upper surface of the die pad in such a manner the rear surface of the semiconductor chip is opposed to the upper surface of the die pad, a plurality of wires for electrically connecting the plurality of bonding pads with the plurality of first leads, and a sealing body for sealing the semiconductor chip and the plurality of wires therewith. Furthermore, the lower surface of the die pad, a portion of the plurality of suspension leads, a portion of the plurality of first leads, and a portion of the plurality of second leads are exposed from the sealing body. The shape of the sealing body is comprised of quadrangle. The plurality of suspension leads extend from the die pad to a plurality of corner portions of the sealing body, in the plan view. The suspension leads each have one end portion connected to the die pad, the other end portion, and an intermediate portion located between the one end portion and the other end portion. Some of the second leads are connected at the intermediate portion of each of the suspension leads, or at the die pad side of each of the suspension leads from the intermediate portion.

Advantages available from typical inventions, among the inventions disclosed herein, will next be descried briefly.

In the fabrication of a semiconductor device, distortion of suspension leads can be suppressed.

In addition, it is possible to obtain a semiconductor device having improved reliability.

DETAILED DESCRIPTION

Figure 1:
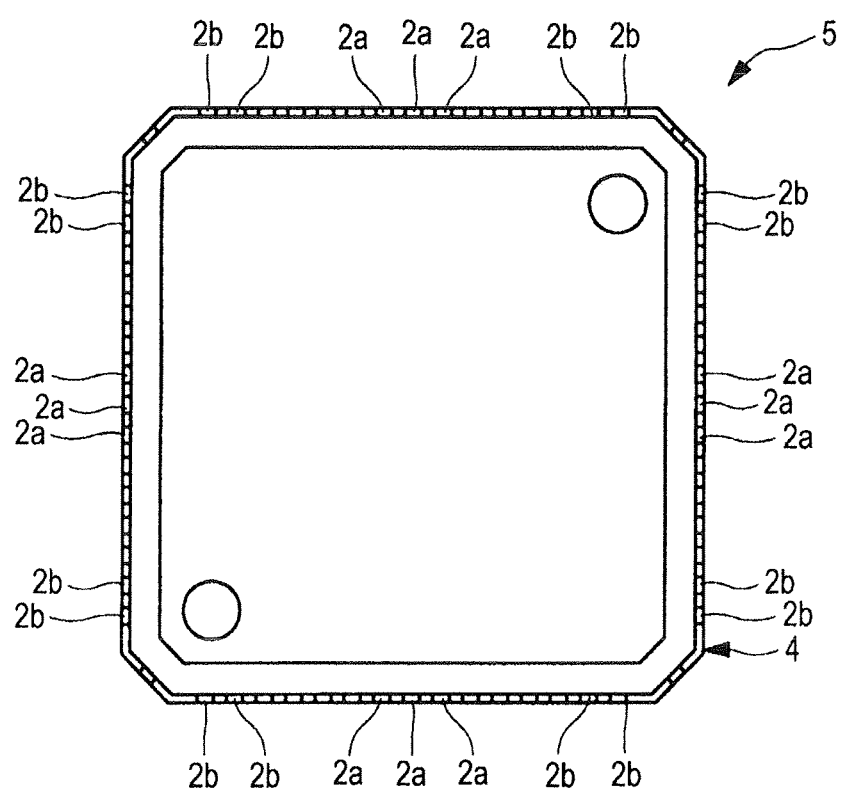
FIG. 1 is a plan view showing one example of the structure of a semiconductor device according to the embodiment of the invention.

In the following embodiments, a repeated description of the same or like parts will be omitted in principle unless particularly necessary.

In the following embodiments, a description will be made after divided into a plurality of sections or embodiments if necessary for convenience sake. They are not independent from each other, but in a relation such that one is a modification example, details, a complementary description, or the like of a part or whole of the other one unless otherwise specifically indicated.

In the following embodiments, when a reference is made to the number of elements (including the number, value, amount, range, or the like), the number is not limited to a specific number but may be greater than or less than the specific number, unless otherwise specifically indicated or principally apparent that the number is limited to the specific number.

Further, in the following embodiments, it is needless to say that the constituent elements (including element steps or the like) are not always essential unless otherwise specifically indicated or principally apparent that they are essential.

With regard to any constituent element in the following embodiments, the term "composed of A", "made of A", "has A", or "contains A" does not exclude another element unless otherwise specifically indicated that it is composed of, is made of, has, or contains only the element. Similarly, in the following embodiments, when a reference is made to the shape, positional relationship, or the like of the constituent elements, that substantially approximate or similar to it is also embraced unless otherwise specifically indicated or principally apparent that it is not. This also applies to the above-described value and range.

The invention will hereinafter be described in detail based on drawings. In all the drawings for describing the below-described embodiments, members of a like function will be identified by like reference numerals and overlapping descriptions will be omitted.

Embodiment

Figure 2:
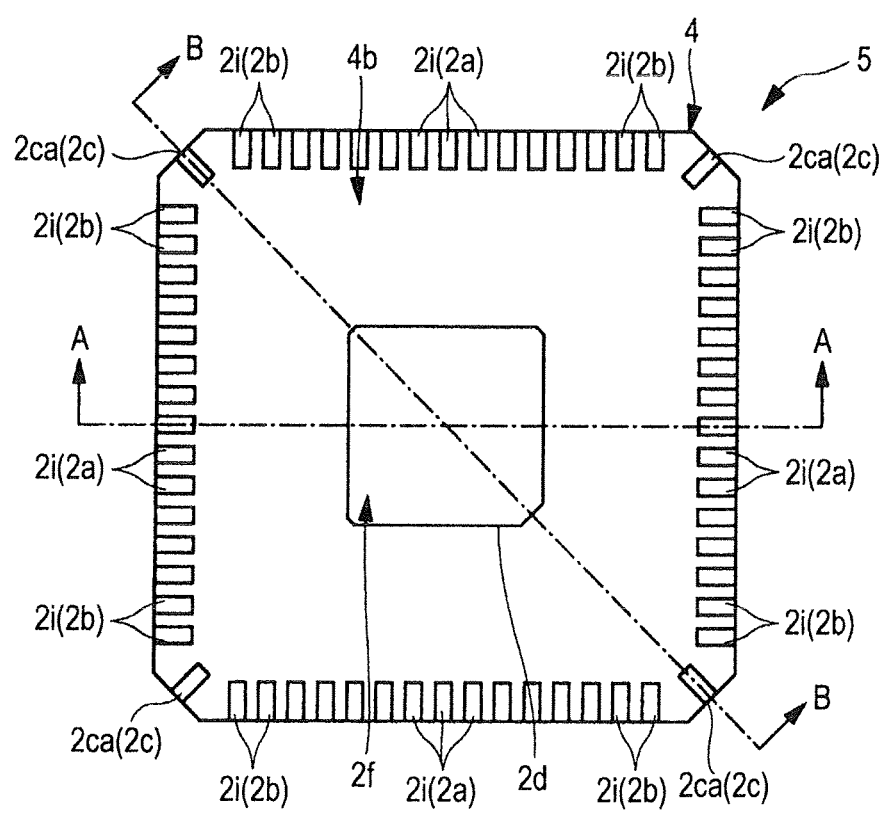
FIG. 2 is a back-surface view showing the one example of the structure of the semiconductor device shown in FIG. 1.
Figure 3:
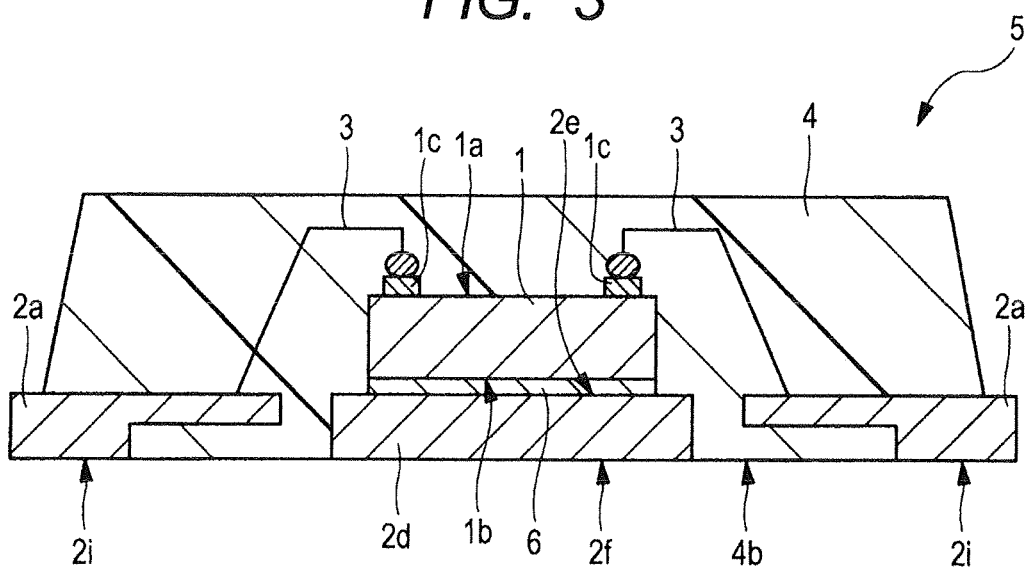
FIG. 3 is a cross-sectional view showing one example of the structure taken along the line A-A of FIG. 2.
Figure 4:
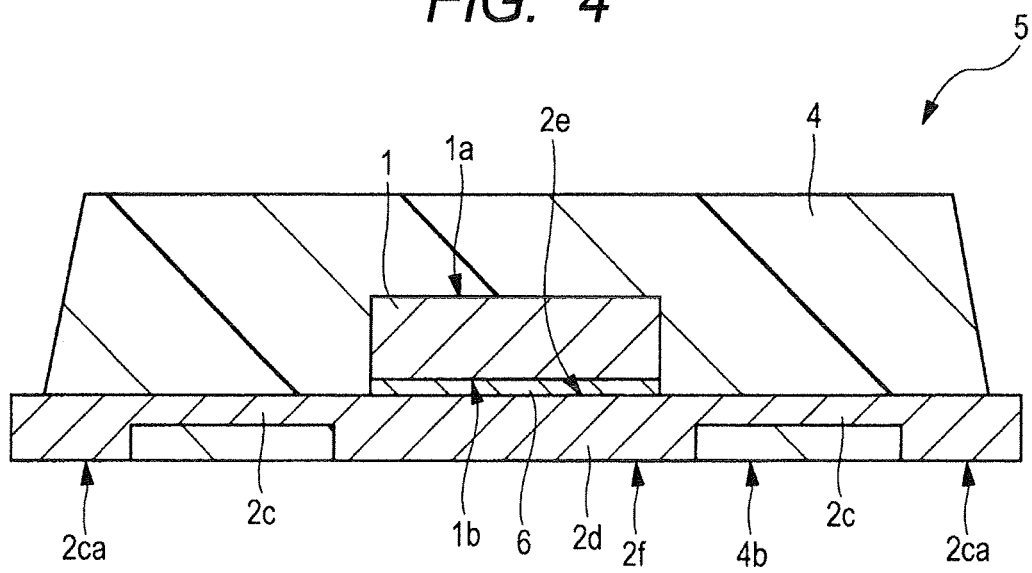
FIG. 4 is a cross-sectional view showing one example of the structure taken along the line B-B of FIG. 2.
Figure 5:
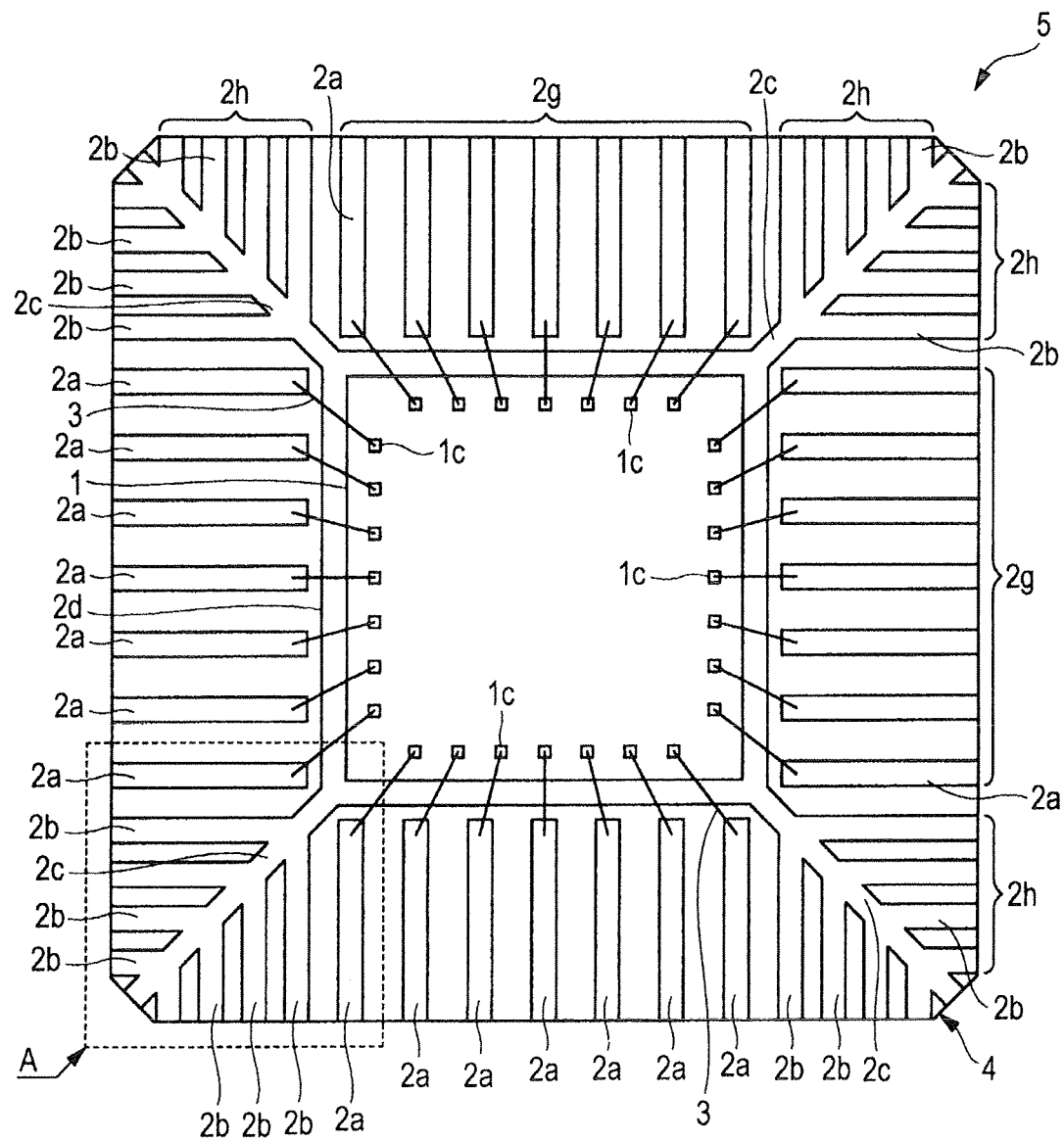
FIG. 5 is a plan view showing, through a sealing body, one example of the structure of the semiconductor device of FIG. 1.
Figure 6:
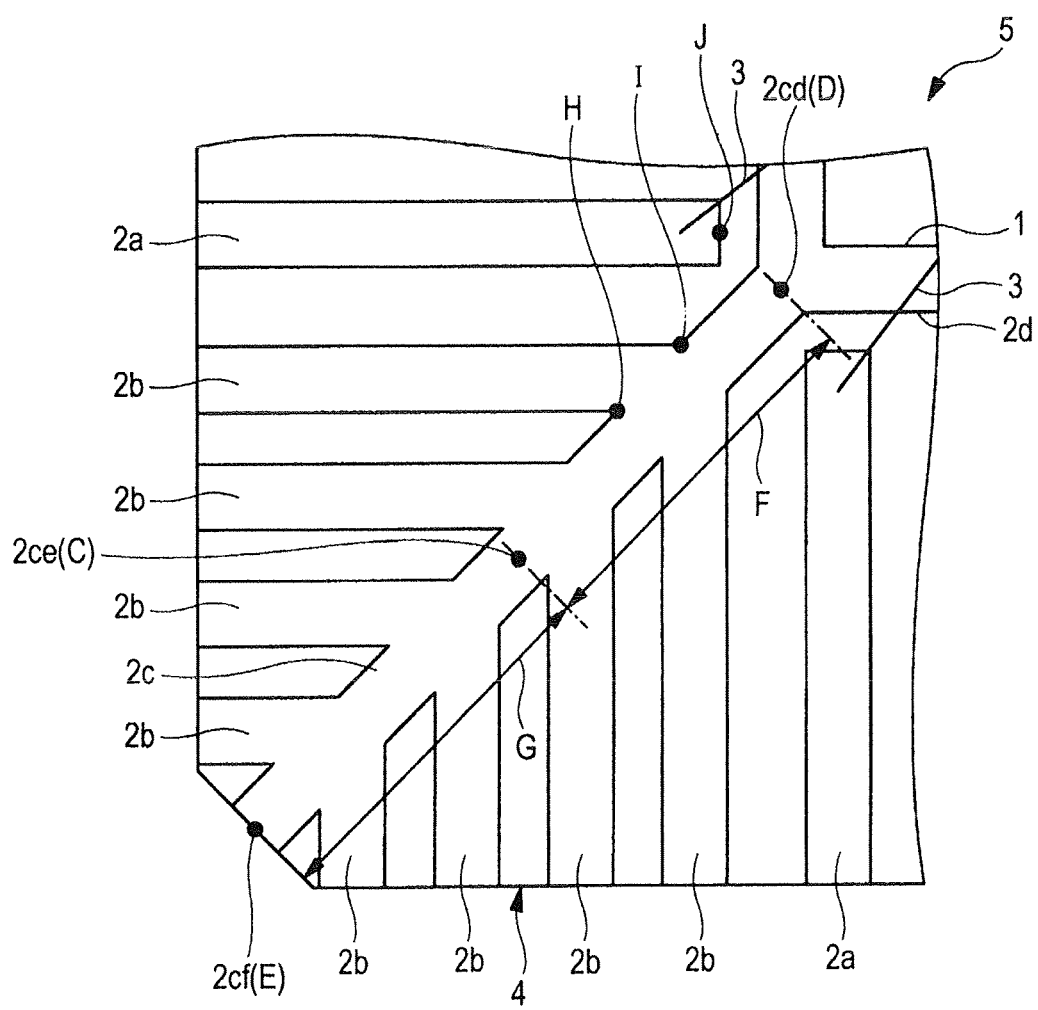
FIG. 6 is an enlarged partial plan view showing the structure of the portion A of FIG. 5.

FIG. 1 is a plan view showing one example of the structure of a semiconductor device according to the embodiment of the invention; FIG. 2 is a back-surface view showing the one example of the structure of the semiconductor device illustrated in FIG. 1; FIG. 3 is a cross-sectional view showing one example of the structure taken along the line A-A of FIG. 2; FIG. 4 is a cross-sectional view showing one example of the structure taken along the line B-B of FIG. 2; FIG. 5 is a plan view showing, through a sealing body, one example of the structure of the semiconductor device of FIG. 1; and FIG. 6 is an enlarged partial plan view showing the structure of the portion A of FIG. 5.

First, a description will be made on the structure of the semiconductor device according to the present embodiment.

In the semiconductor device according to the present embodiment shown in FIGS. 1 to 6, a plurality of leads serving as an external terminal are arranged, in a plan view, at the periphery on the back surface side of the semiconductor device. A description will hereinafter be made using, as an example, a resin sealing type QFN 5 obtained by sealing a semiconductor chip and the like with a resin.

With regard to the detailed configuration, the QFN 5 has a die pad 2d (also called a tab) which is a chip mounting portion in the sheet form and has a shape of substantially quadrangle in a plan view, a plurality of suspension leads 2c for supporting the die pad 2d (coupled to the die pad 2d), a plurality of leads 2a which are first leads spaced apart from the die pad 2d and at the same time, arranged adjacent to the die pad 2d, and a plurality of leads 2b which are second leads spaced apart from the die pad 2d and at the same time, supporting the suspension leads 2c (coupled to the suspension leads 2c).

This means that, as shown in FIG. 5, the suspension leads 2c are coupled to four corner portions of the substantially quadrangular die pad 2d having thereon the semiconductor chip 1 so that in the QFN 5, the die pad 2d is supported, at the corner portions thereof, with four suspension leads 2c arranged diagonally on the die pad 2d.

In regions partitioned with these four suspension leads 2c, in other words, in regions between any two adjacent suspension leads 2c, the leads are arranged in a line along each of the four sides of the semiconductor chip 1.

Accordingly, in a region between two adjacent suspension leads 2c, a lead group (first lead group) 2g composed of a plurality of leads (first leads) 2a and a lead group (second lead group) 2h composed of a plurality of leads (second leads) 2b are arranged.

Incidentally, the plurality of leads 2b configuring the lead group (second lead group) 2h is coupled to the suspension leads 2c and compared with the plurality of leads 2a configuring the lead group (first lead group) 2g, they are arranged at a position closer to the suspension leads 2c. On the other hand, the plurality of leads 2a configuring the lead group (first lead group) 2g is arranged, along one side of the semiconductor chip, in a region sandwiched between a lead group 2h arranged on the side of a certain suspension lead 2c (the suspension lead 2c, for example, on the left bottom side in FIG. 5) and another lead group 2h arranged on the side of another suspension lead 2c (the suspension lead 2c, for example, on the right bottom side in FIG. 5) adjacent to the certain suspension lead 2c.

In the present embodiment, as shown in FIG. 5, the pitch between leads (distance between two adjacent leads 2b) in the lead group (second lead group) 2h is smaller than the pitch between leads (distance between two adjacent leads 2a) in the lead group (first lead group) 2g. The pitch between leads is not limited thereto, but the pitch between leads in the lead group (second lead group) 2h may be equal to the pitch between leads in the lead group (first lead group) 2g.

The semiconductor chip 1 has a front surface 1a, a rear surface 1b opposite to the front surface 1a, and a plurality of bonding pads 1c formed on the front surface 1a and it has therein a semiconductor integrated circuit. A plurality of bonding pads 1c formed on the front surface 1a is arranged at the periphery of the front surface 1a along four sides of the rectangular front surface 1a.

As shown in FIGS. 3 and 4, the semiconductor chip 1 is mounted, with a die bonding material 6 serving as an adhesive material, on the upper surface 2e of the die pad 2d on which the chip is to be mounted such that the rear surface 1b of the semiconductor chip faces to the upper surface 2e. As shown in FIG. 5, the plurality of bonding pads 1c and the plurality of leads 2a corresponding thereto are electrically connected with each other via a plurality of wires 3.

The QFN 5 has, as shown in FIGS. 3 and 4, has a sealing body 4 for sealing the semiconductor chip 1, the plurality of wires 3, a portion of the die pad 2d, a portion of the leads 2a, and a portion of the leads 2b. Incidentally, the sealing body 4 is comprised of a sealing resin and as shown in FIGS. 1 and 2, a shape in plan view of the sealing body 4 is comprised of quadrangle.

Figure 7:
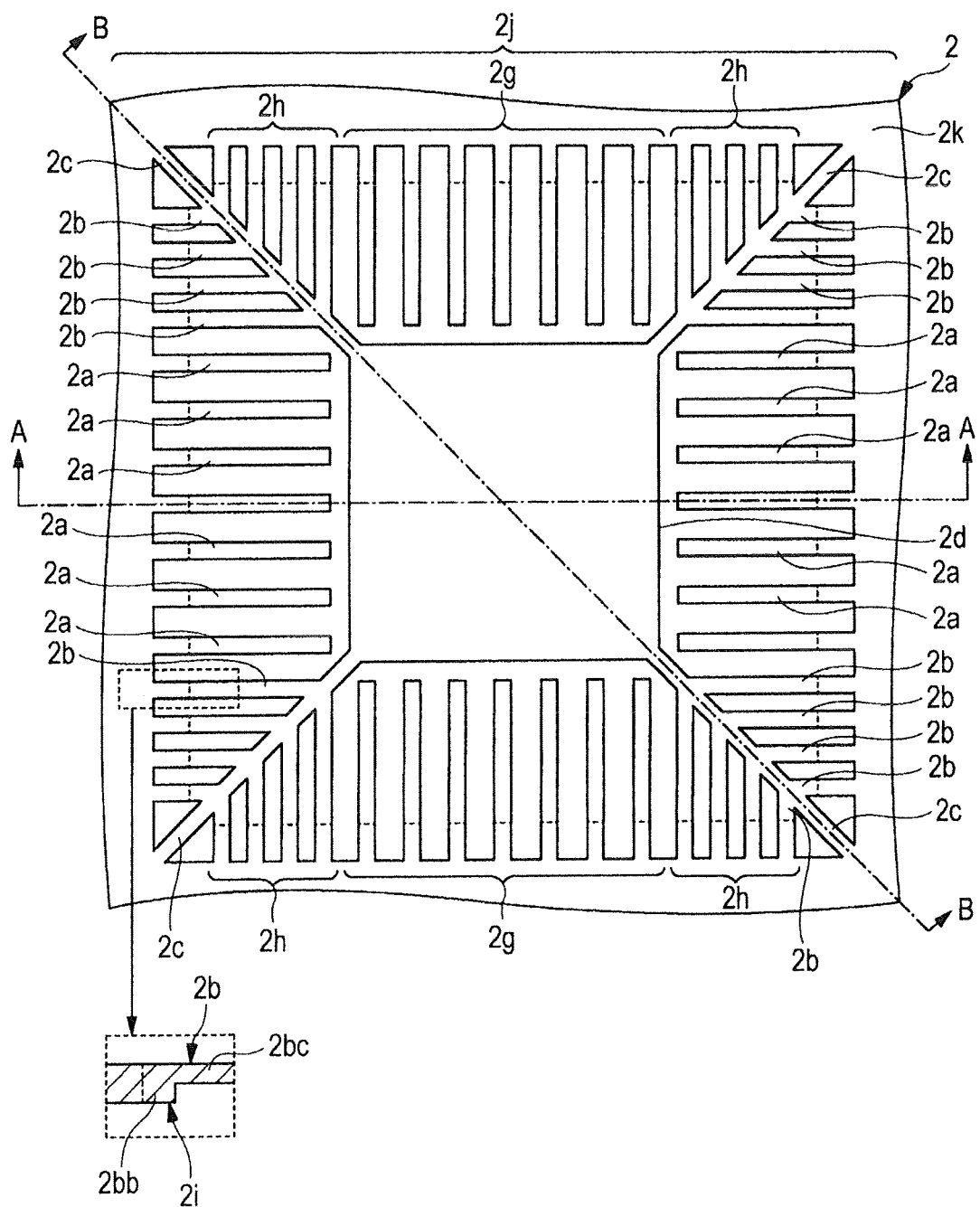
FIG. 7 includes an enlarged partial plan view and a partial cross-sectional view each showing one example of the structure of a device region of a lead frame to be used in the fabrication of the semiconductor device of FIG. 1.
Figure 17:
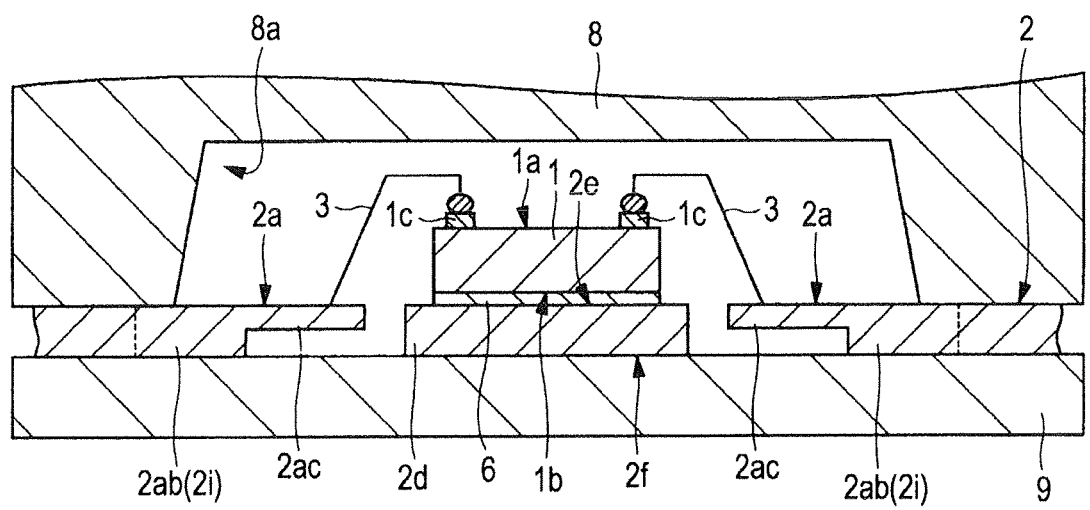
FIG. 17 is a partial cross-sectional view showing one example of the structure taken along the line A-A of FIG. 16.

The QFN 5 of the present embodiment is fabricated by an individual molding system in which resin molding is performed while covering each of device regions 2j of the lead frame 2 shown in FIG. 7 with a cavity portion 8a of a resin molding die shown in FIG. 17. In this case, as shown in FIGS. 1 and 2, the sealing body 3 is beveled at the corner portions thereof. In the present embodiment, the planar shape of the sealing body with beveled corners is regarded as quadrangle.

As shown in FIGS. 2 to 4, in the QFN 5, the lower surface 2f of the die pad 2d opposite to the upper surface 2e is exposed from the bottom surface 4b of the sealing body 4. This means that the QFN 5 is a die-pad exposed type (tab exposed type) semiconductor package.

Furthermore, the QFN 5 is a peripheral type so that a plurality of external terminal portions 2i of the leads 2a and the leads 2b exposed (partially) from the sealing body 4 and a plurality of outer portions 2ca of the suspension leads 2c exposed (partially) from the sealing body 4 are, as shown in FIG. 2, arranged at the periphery of the bottom surface 4b of the sealing body 4.

A portion of each of the leads 2a and the leads 2b other than that exposed from the bottom surface 4b of the sealing body 4 as the external terminal portion 2i (a portion to be buried in the sealing body 4) is half-etched to have a thickness about half of the external terminal portion 2i as shown in FIG. 3.

Similarly, a portion of each of the suspension leads 2c other than that exposed from the bottom surface 4b of the sealing body 4 as the outer portion 2ca and a portion other than the die pad 2d are, as a portion to be buried in the sealing body 4, half-etched to have a thickness of about half of the outer portion 2ca or the die pad 2d as shown in FIG. 4.

In addition, a wire length is reduced in the QFN 5 of the present embodiment. This means that in order to reduce the wire length, external dimensions of the die pad 2d are decreased and the length of each of the leads 2a to be connected to the wire 3 is decreased (the distance between the end portion of each of the leads 2a and the semiconductor chip 1 is decreased).

The external dimensions of the die pad 2d are decreased so that the length of the plurality of the suspension leads 2c (four suspension leads in the present embodiment) supporting the die pad 2d at the corner portions thereof becomes longer inevitably.

The plurality of suspension leads 2c extends from the corner portions of the die pad 2d to the corner portions of the sealing body 4, respectively, in the plan view.

Each of the plurality of suspension leads 2c has, as shown in FIG. 6, one end portion 2cd connected to the die pad 2d, the other end portion 2cf on the opposite side of the one end portion 2cd, and an intermediate portion 2ce located between the one end portion 2cd and the other end portion 2cf. Some of the plurality of leads 2b, that is, at least one of the plurality of leads 2b is connected (linked) at the intermediate portion 2ce of each of the suspension leads 2c, or at the die pad side of each of the suspension leads 2c from the intermediate portion 2ce.

More specifically, in FIG. 6, when the intermediate portion 2ce of the suspension lead 2c is designated as a portion C, the one end portion 2cd of the suspension lead 2c connected to the die pad 2d is designated as a portion D, and the other end portion 2cf of the suspension lead 2c opposite to the one end portion 2cd is designated as a portion E, the distance F between the portion C and the portion D is equal to the distance G between the portion C and the portion E and moreover, at least one of the plurality of leads 2b configuring the lead group 2h is coupled to a position of the suspension lead 2c between the portion C and the portion D or the portion C of the intermediate portion 2ce. In the QFN 5 of the present embodiment, as shown in FIG. 6, four leads 2b are coupled (linked) to the suspension lead 2c at the portion C of the intermediate portion 2ce or at between the portion C and the portion D. Further, another four short leads 2b are coupled (linked) to the suspension lead 2c between the portion C of the intermediate portion 2ce and the portion E of the other end portion 2cf.

Thus, the plurality of leads 2b is linked (coupled) to each of the plurality of suspension leads 2c and each of the plurality of leads 2b has an external terminal portion 2i exposed from the bottom surface 4b of the sealing body 4. When the QFN 5 is mounted by soldering on a mounting substrate, therefore, each of the external terminal portions 2i can be mounted by soldering and the packaging strength of the QFN ban be improved. As a result, the QFN 5 has enhanced mounting reliability.

In the QFN 5, each of the leads 2a of the lead group 2g composed of a plurality of leads 2a is longer than each of the leads 2b of the lead group 2h composed of a plurality of leads 2b. In short, each of the leads 2a of the lead group 2g is longer than each of the leads 2b of the lead group 2h. More specifically, as shown in FIG. 6, when two contact points between the suspension lead 2c and the longest lead 2b arranged closest to the center (closest to the lead group 2g) among four leads 2b arranged in the vicinity of the end portion of one of the sides of the sealing body 4 are designated as a first contact point H and a second contact point I, an end portion J, on the side of the die pad 2d, of a lead 2a which is arranged adjacent to this lead 2b is located closer to the die pad 2d than the second contact point I which is closer to the portion D of the suspension lead 2c when the distance thereto is compared between the first contact point H and the second contact I. In short, each of the plurality of leads 2a is longer than even the longest lead 2b among the four leads 2b.

Accordingly, the distance between each of the leads 2a and the semiconductor chip 1 decreases, making it possible to reduce the wire length and thereby achieve the speed-up of the QFN 5.

As shown in FIGS. 2 and 3, the outer portion 2ca of each of the suspension leads 2c is exposed from the bottom surface (mounting surface) 4b from the corner portion of the sealing body 4.

When the QFN 5 is mounted by soldering on a mounting substrate, the outer portion 2ca of each of the plurality of suspension leads 2c as well as the plurality of leads 2a and the plurality of leads 2b can be mounted by soldering, making it possible to improve the mounting strength of the QFN 5.

In addition, as shown in FIGS. 4 and 6, the other end portion 2cf (portion E) of the suspension lead 2c is exposed from the sealing body 4 so that the QFN 5 thus obtained can exhibit a further improved heat dissipation effect.

Furthermore, since the plurality of leads 2b is linked (coupled) to each of the plurality of suspension leads 2c so that the number of dissipation routes, via the die pad 2d and the suspension leads 2c, of heat generated from the semiconductor chip 1 can be increased. As a result, the QFN 5 can have improved heat dissipation properties (have reduced heat resistance).

Incidentally, in the QFN 5, as shown in FIGS. 5 and 6, no wire 3 is coupled to each of the leads 2b of the lead group 2h. This means that in the QFN 5, the wire 3 is electrically connected with each of the leads 2a, while no wire 3 is connected to each of the leads 2b.

In the QFN 5, each of the leads 2a and each of the leads 2b and moreover, the die pad 2d and each of the suspension leads 2c are composed of, for example, a copper alloy, but they may be composed of an alloy other than copper alloy, such as iron-nickel alloy. The wire 3 is, for example, a gold wire. The sealing body 4 is made of, for example, a sealing resin such as epoxy resin.

Next, a manufacturing method of the QFN (semiconductor device) 5 according to the present embodiment will next be described.

Figure 8:
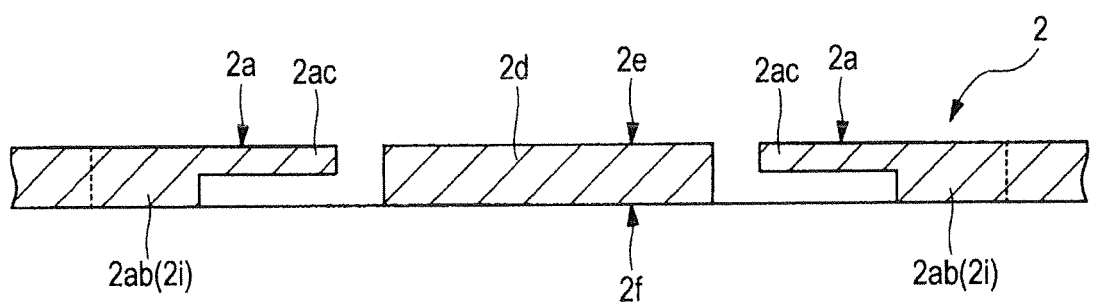
FIG. 8 is a partial cross-sectional view showing one example of the structure taken along the line A-A of FIG. 7.
Figure 9:
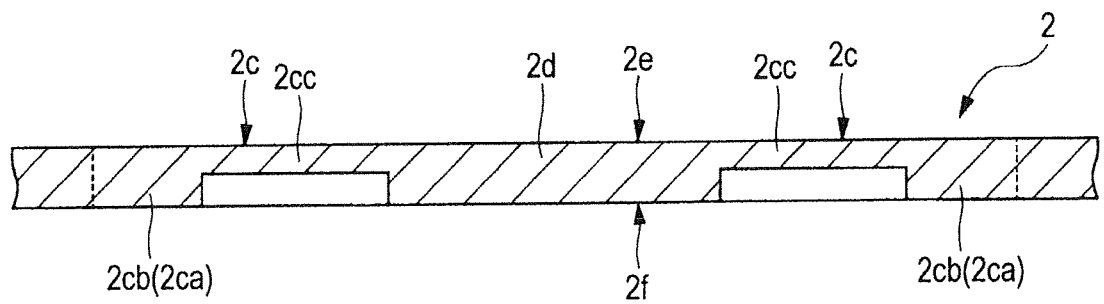
FIG. 9 is a partial cross-sectional view showing one example of the structure taken along the line B-B of FIG. 7.
Figure 10:
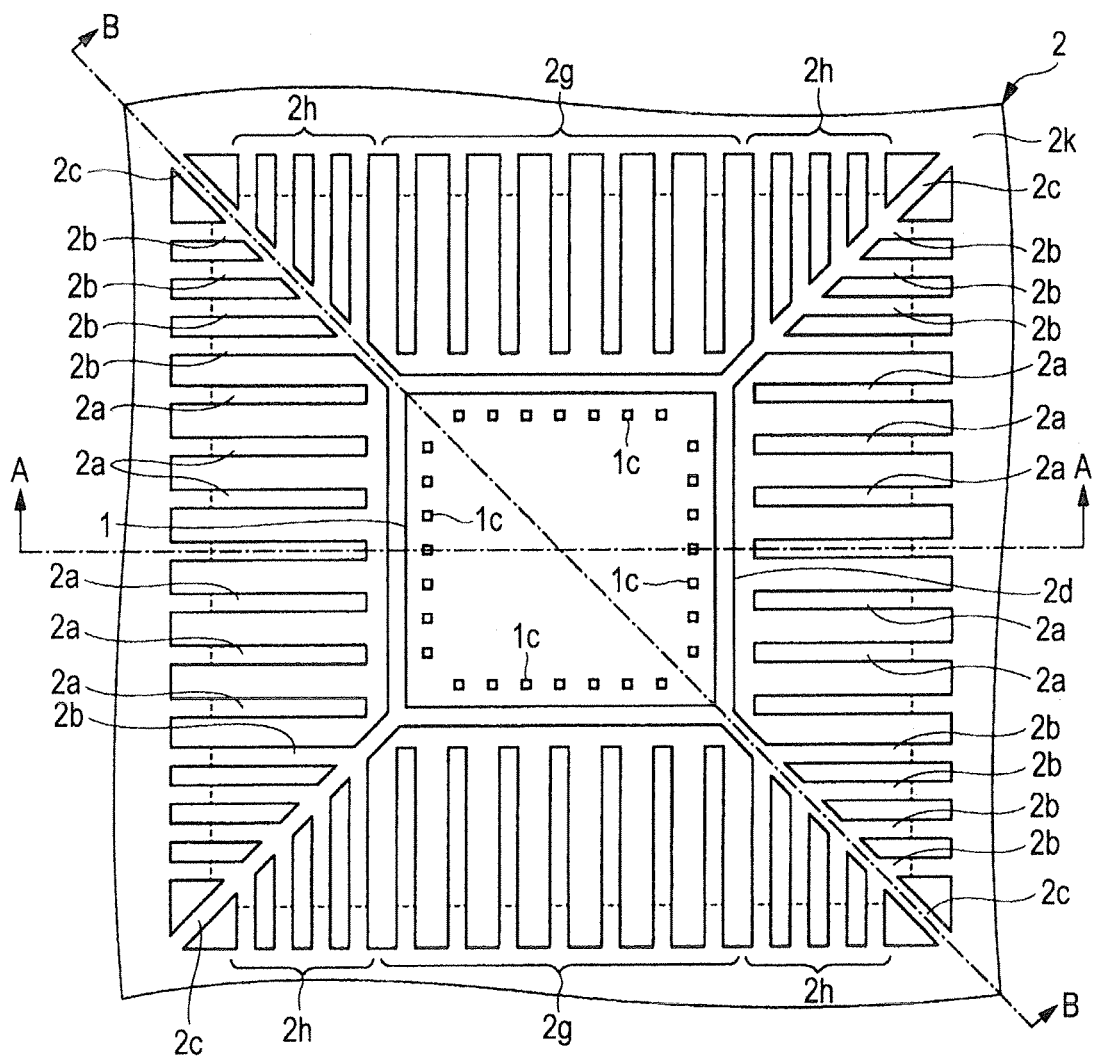
FIG. 10 is an enlarged partial plan view showing one example of the structure after die bonding in the fabrication of the semiconductor device of FIG. 1.
Figure 11:
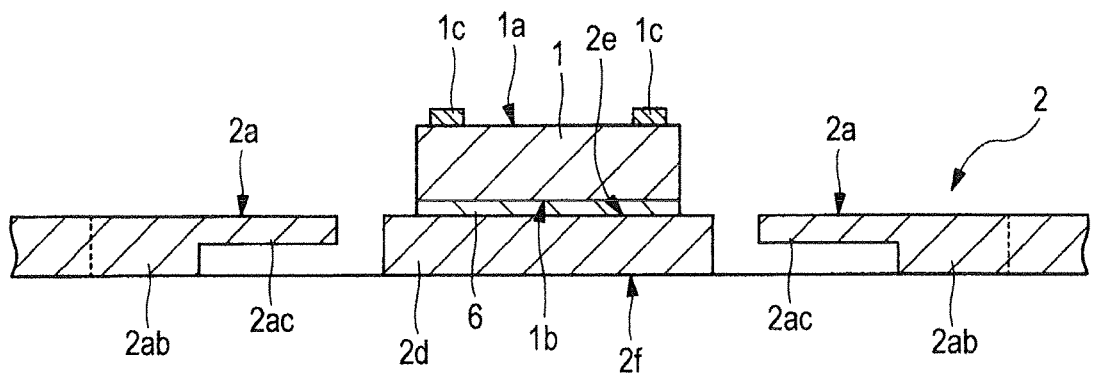
FIG. 11 is a partial cross-sectional view showing one example of the structure taken along the line A-A of FIG. 10.
Figure 12:
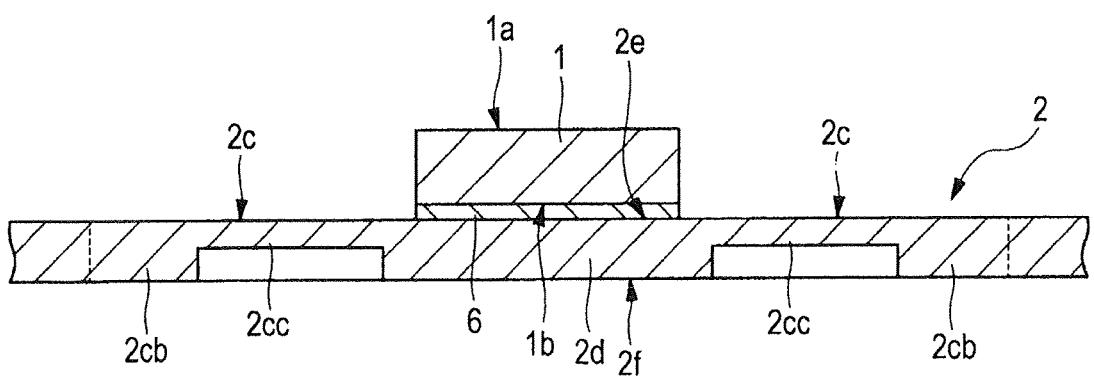
FIG. 12 is a partial cross-sectional view showing one example of the structure taken along the line B-B of FIG. 10.

FIG. 7 includes an enlarged partial plan view and a partial cross-sectional view showing one example of the structure of a device region of a lead frame to be used for the fabrication of the semiconductor device of FIG. 1; FIG. 8 is a partial cross-sectional view showing one example of the structure taken along the line A-A of FIG. 7; FIG. 9 is a partial cross-sectional view showing one example of the structure taken along the line B-B of FIG. 7; FIG. 10 is an enlarged partial plan view showing one example of the structure after die bonding in the fabrication of the semiconductor device of FIG. 1; FIG. 11 is a partial cross-sectional view showing one example of the structure taken along the line A-A of FIG. 10; and FIG. 12 is a partial cross-sectional view showing one example of the structure taken along the line B-B of FIG. 10.

Figure 13:
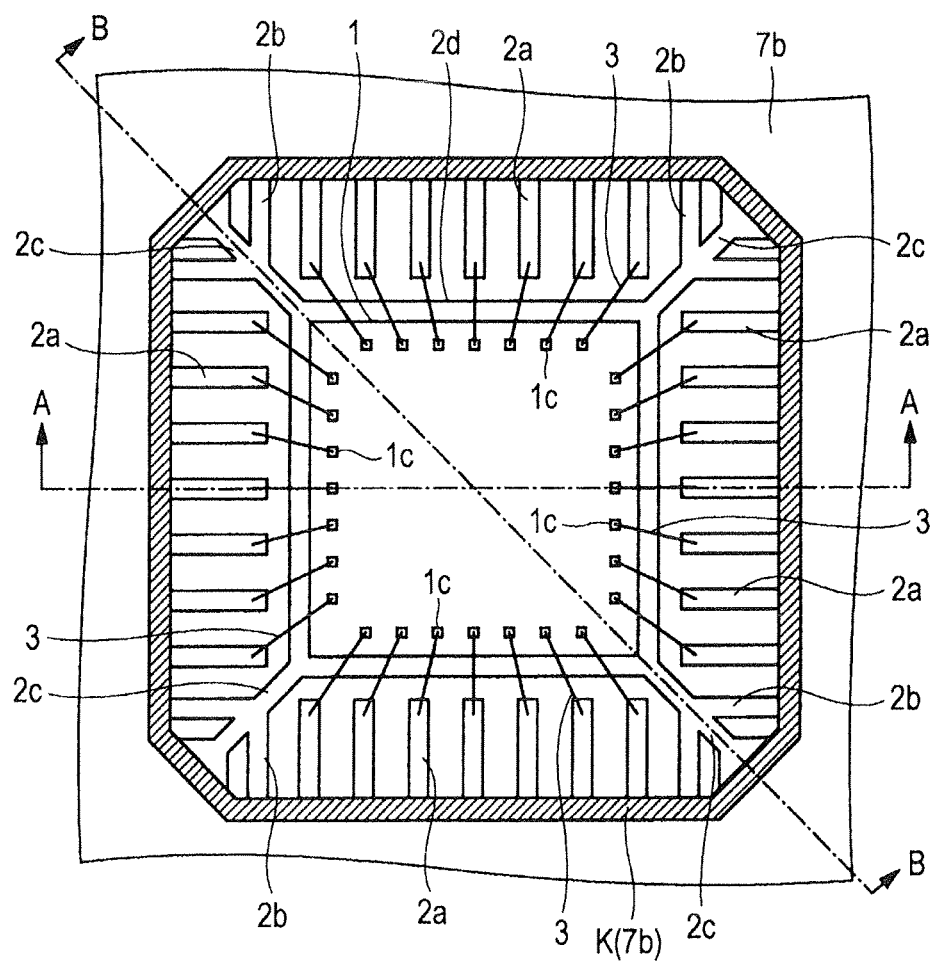
FIG. 13 is an enlarged partial plan view showing one example of the structure upon wire bonding in the fabrication of the semiconductor device of FIG. 1.
Figure 14:
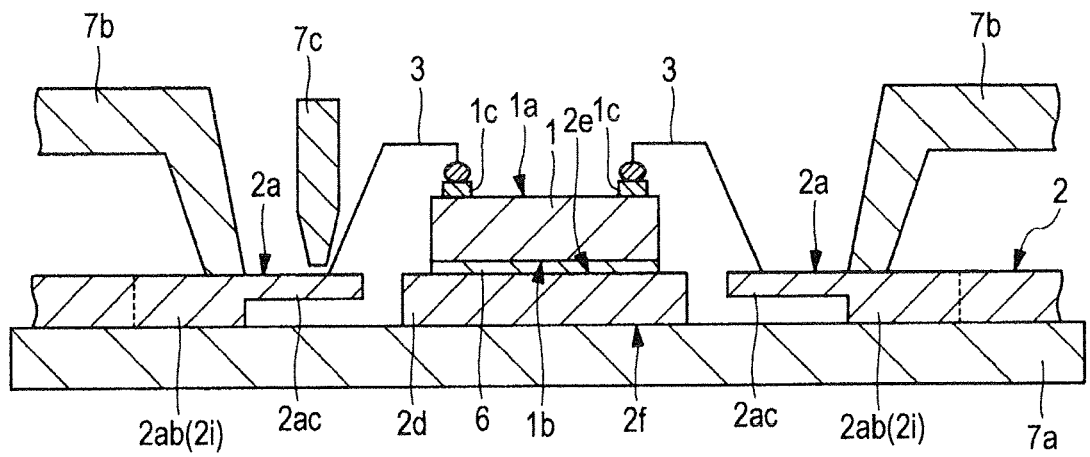
FIG. 14 is a partial cross-sectional view showing one example of the structure taken along the line A-A of FIG. 13.
Figure 15:
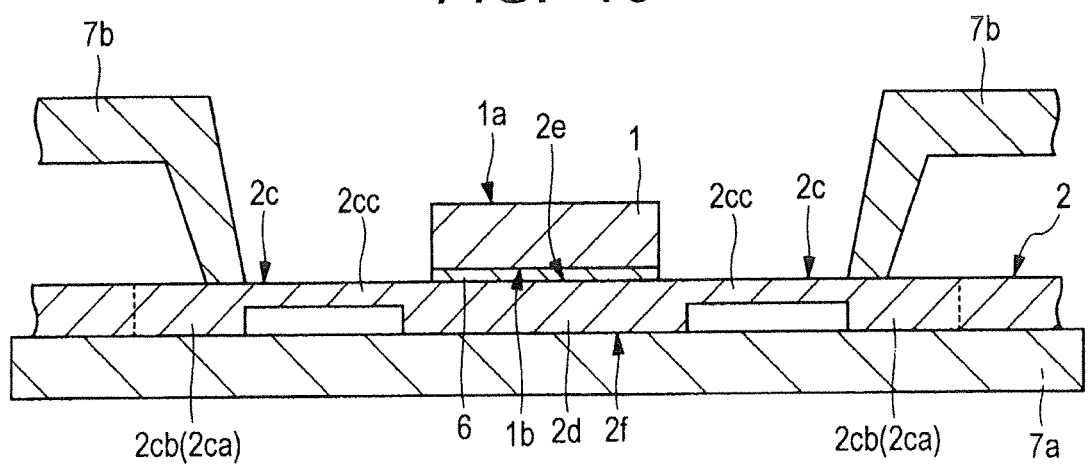
FIG. 15 is a partial cross-sectional view showing one example of the structure taken along the line B-B of FIG. 13.
Figure 16:
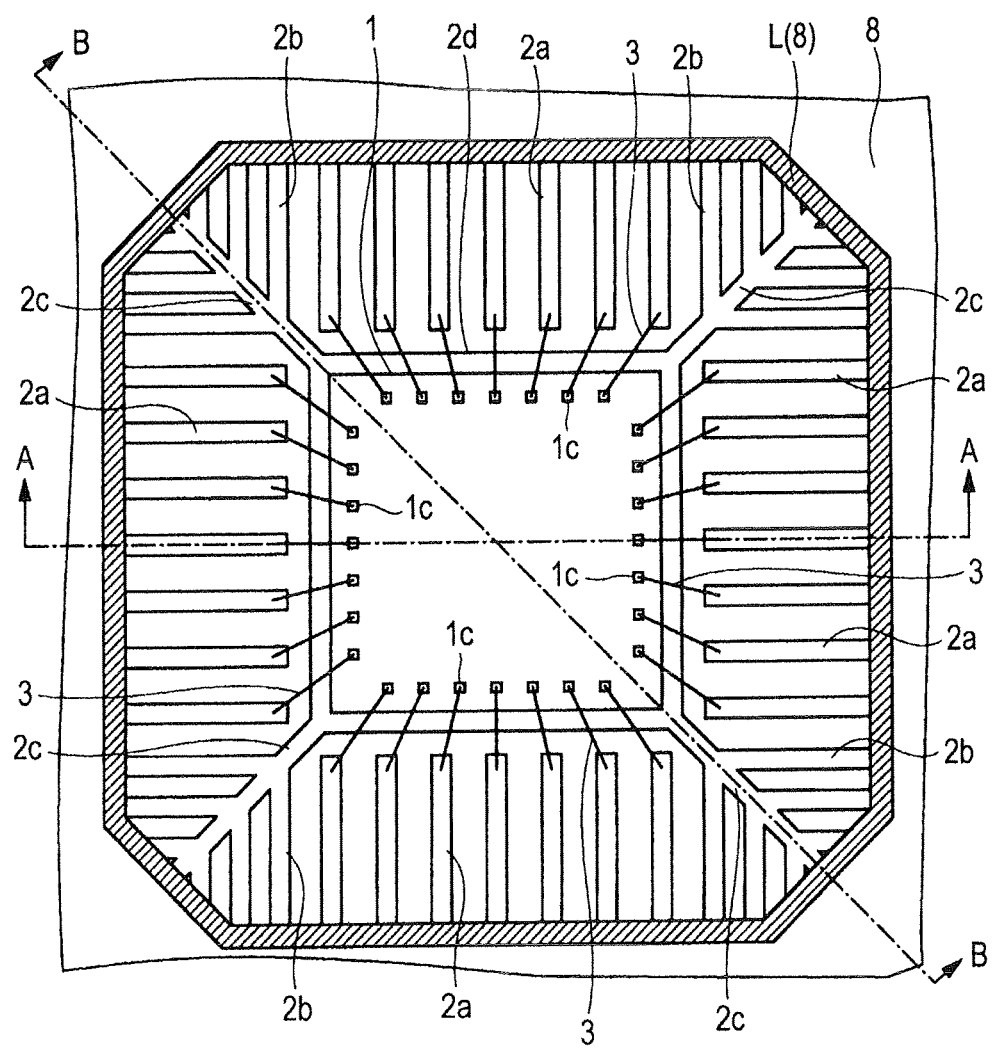
FIG. 16 is an enlarged partial plan view showing, through a cavity, one example of the structure upon mold clamping in the molding step in the fabrication of the semiconductor device of FIG. 1.
Figure 18:
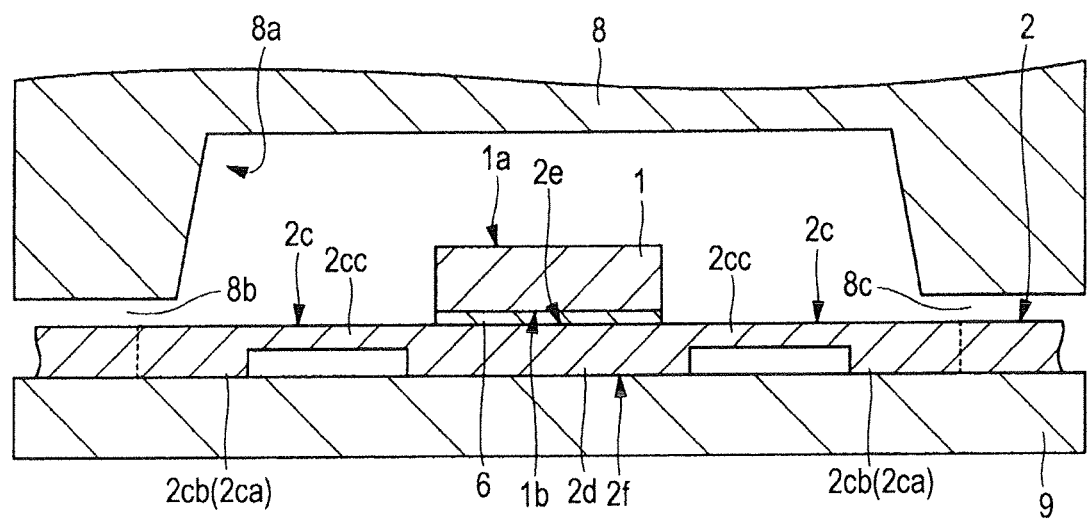
FIG. 18 is a partial cross-sectional view showing one example of the structure taken along the line B-B of FIG. 16.

FIG. 13 is an enlarged partial plan view showing one example of the structure upon wire bonding in the fabrication of the semiconductor device of FIG. 1; FIG. 14 is a partial cross-sectional view showing one example of the structure taken along the line A-A of FIG. 13; FIG. 15 is a partial cross-sectional view showing one example of the structure taken along the line B-B of FIG. 13; FIG. 16 is an enlarged partial plan view showing, through a cavity, one example of the structure upon mold clamping in the molding step in the fabrication of the semiconductor device of FIG. 1; FIG. 17 is a partial cross-sectional view showing one example of the structure taken along the line A-A of FIG. 16; and FIG. 18 is a partial cross-sectional view showing one example of the structure taken along the line B-B of FIG. 16.

Figure 19:
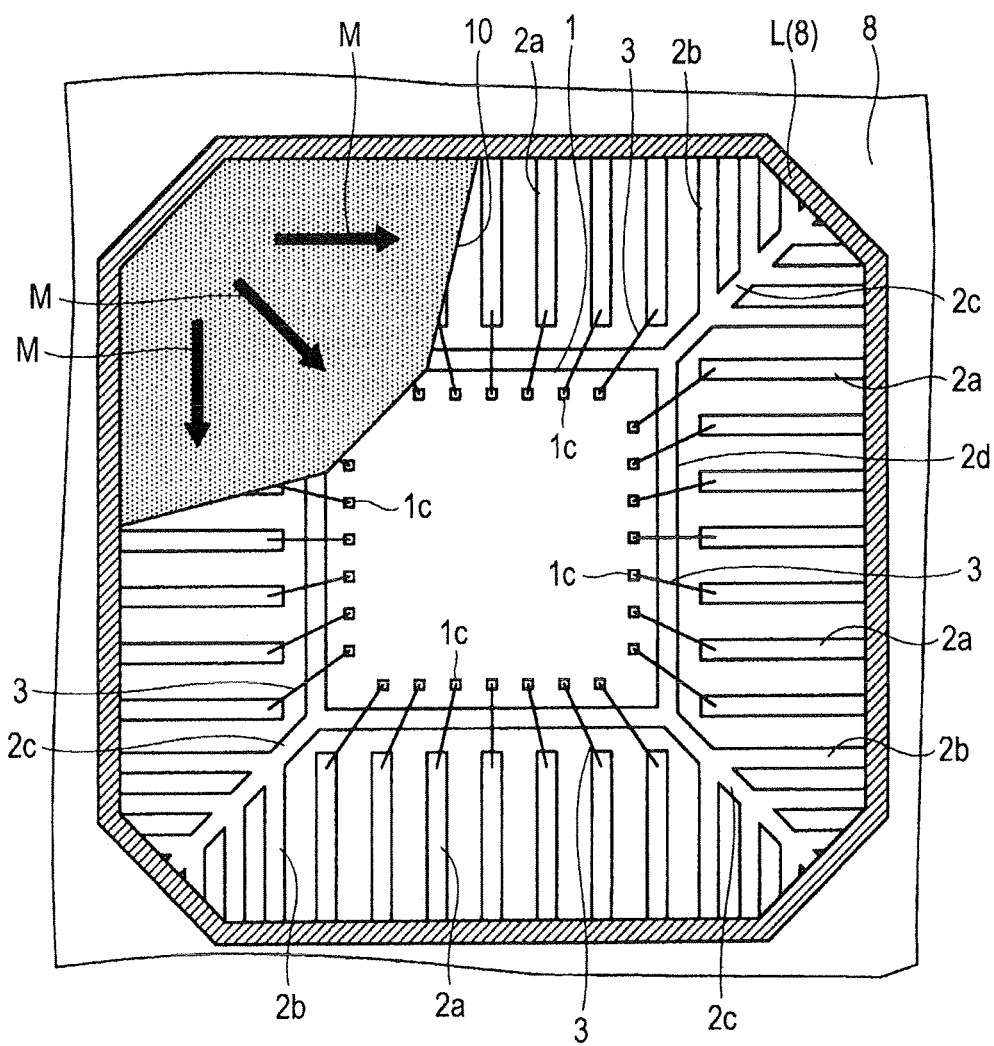
FIG. 19 is an enlarged partial plan view showing, through a cavity, one example of the structure at the initial stage of resin filling in the molding step in the fabrication of the semiconductor device of FIG. 1.
Figure 20:
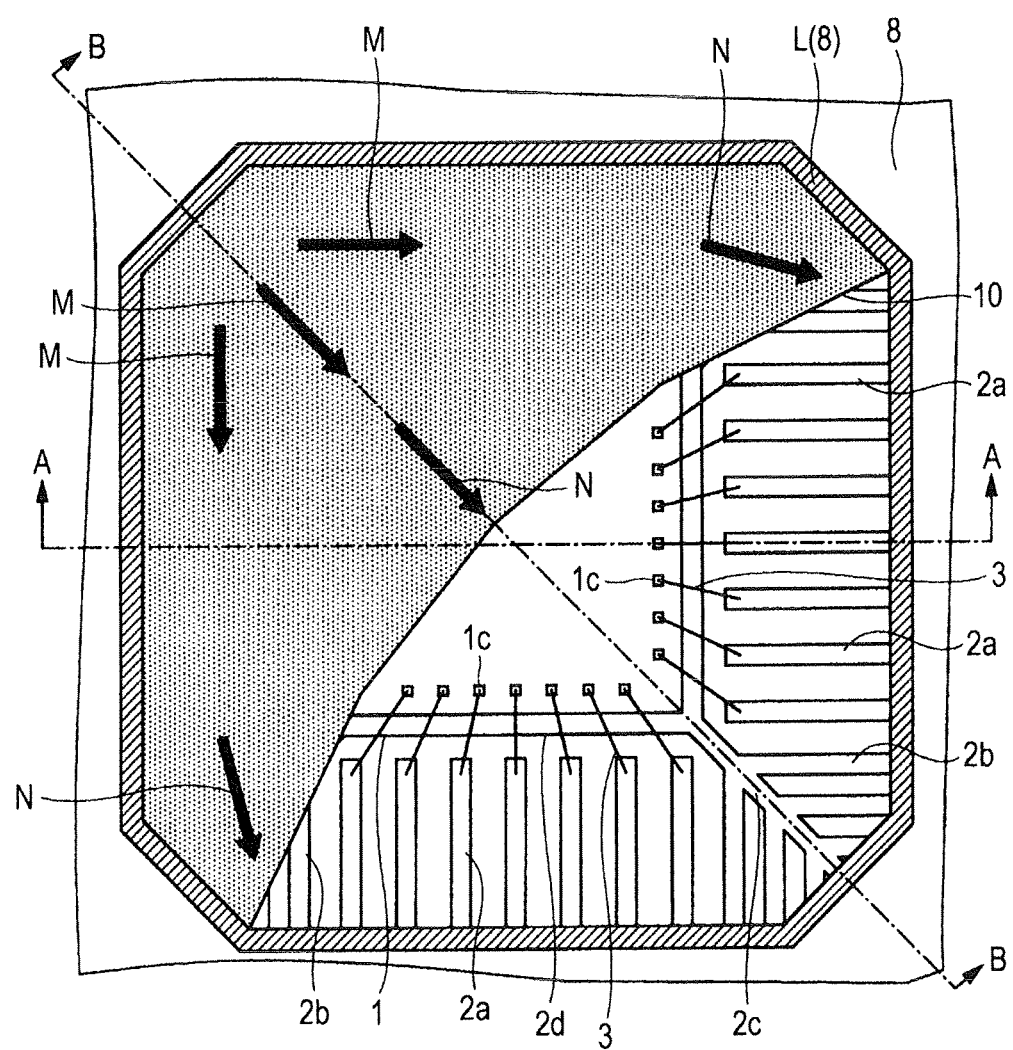
FIG. 20 is an enlarged partial plan view showing, through a cavity, one example of the structure at the middle stage of resin filling in the molding step in the fabrication of the semiconductor device of FIG. 1.
Figure 21:
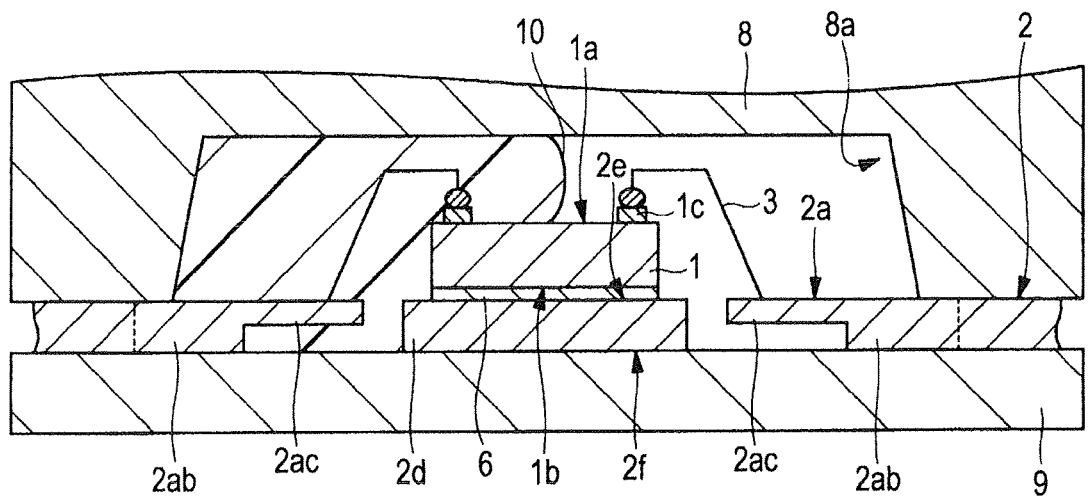
FIG. 21 is a partial cross-sectional view showing one example of the structure taken along the line A-A of FIG. 20.
Figure 22:
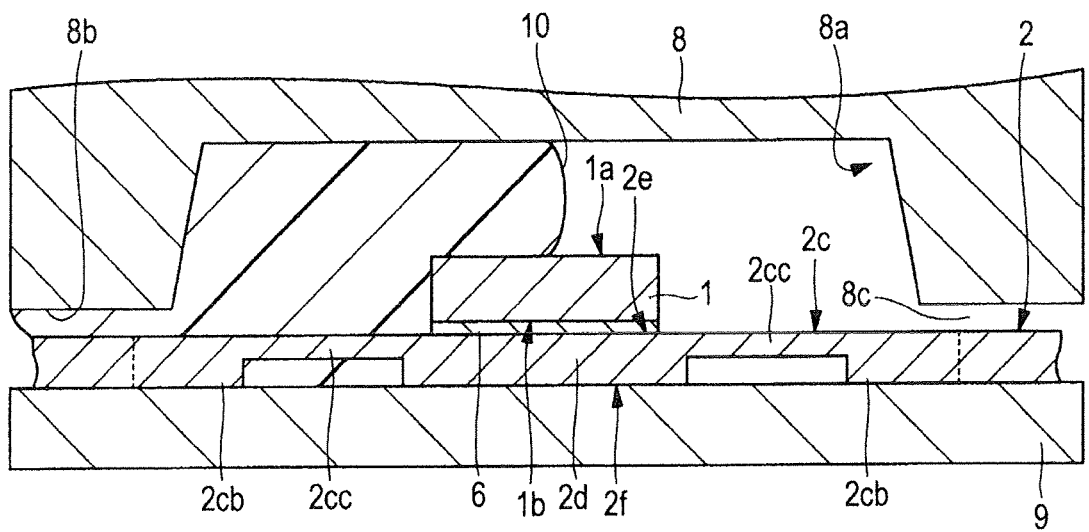
FIG. 22 is a partial cross-sectional view showing one example of the structure taken along the line B-B of FIG. 20.
Figure 23:
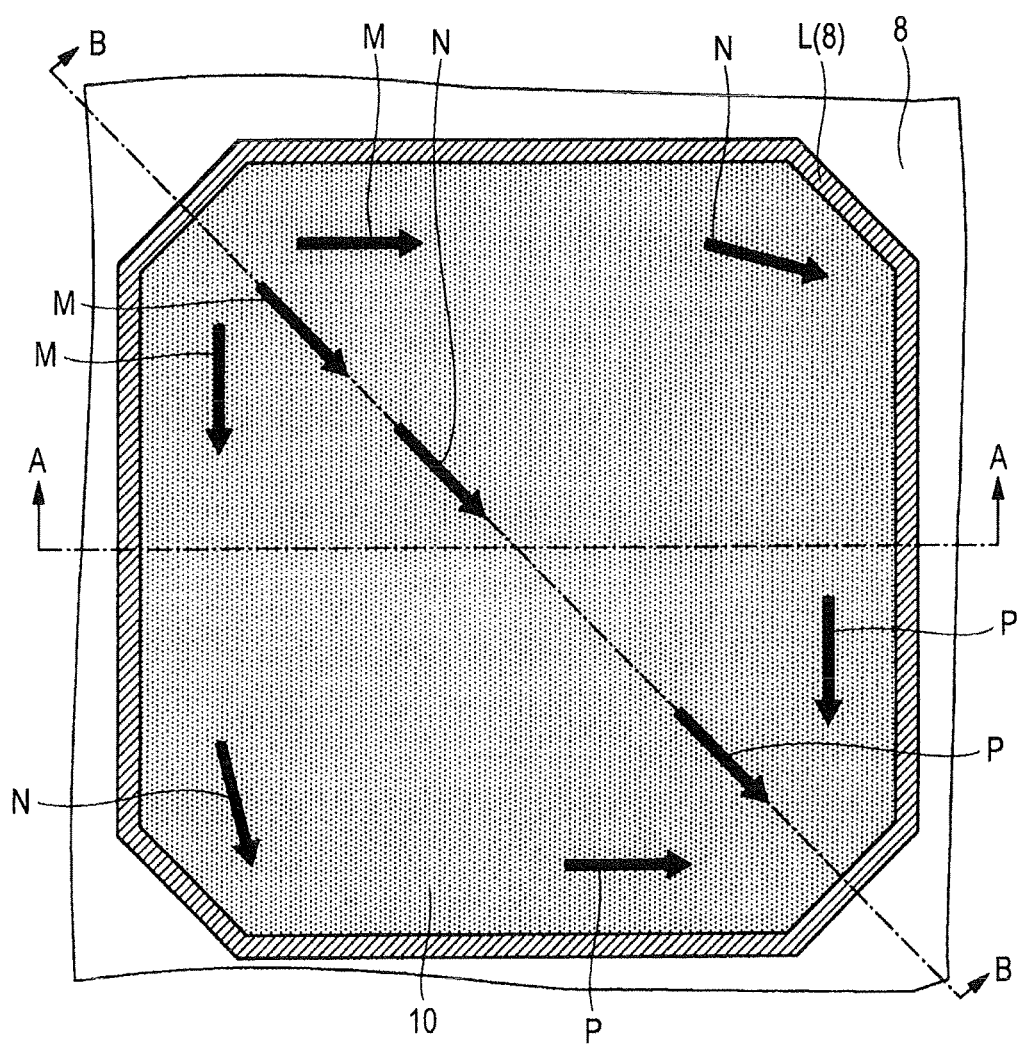
FIG. 23 is an enlarged partial plan view showing, through a cavity, one example of the structure upon completion of resin filling in the molding step in the fabrication of the semiconductor device of FIG. 1.

FIG. 19 is an enlarged partial plan view showing, through a cavity, one example of the structure at the initial stage of resin filling in the molding step in the fabrication of the semiconductor device of FIG. 1; FIG. 20 is an enlarged partial plan view showing, through a cavity, one example of the structure at the intermediate stage of resin filling in the molding step in the fabrication of the semiconductor device of FIG. 1; FIG. 21 is a partial cross-sectional view showing one example of the structure taken along the line A-A of FIG. 20; FIG. 22 is a partial cross-sectional view showing one example of the structure taken along the line B-B of FIG. 20; and FIG. 23 is an enlarged partial plan view showing, through a cavity, one example of the structure upon completion of resin filling in the molding step in the fabrication of the semiconductor device of FIG. 1.

Figure 24:
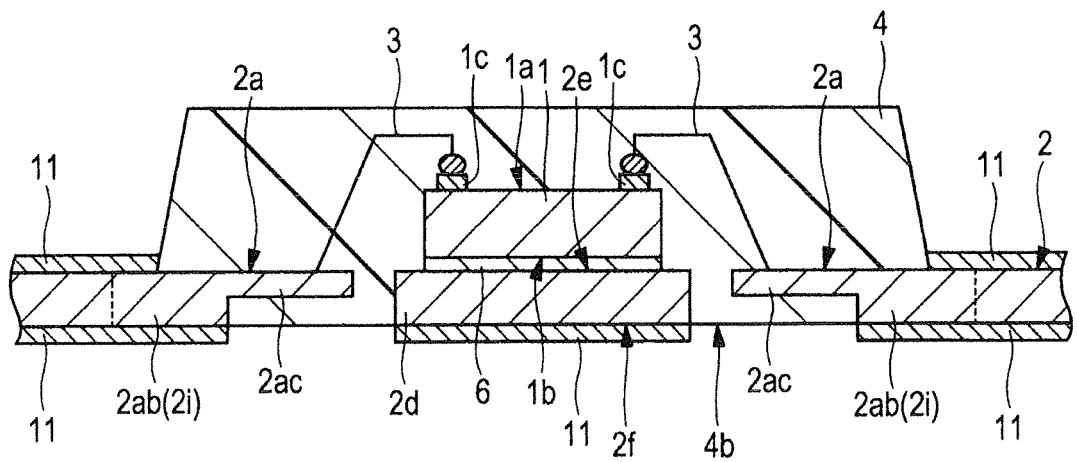
FIG. 24 is a partial cross-sectional view showing one example of the structure after formation of a metallic deposit in the plating step in the fabrication of the semiconductor device of FIG. 1.
Figure 25:
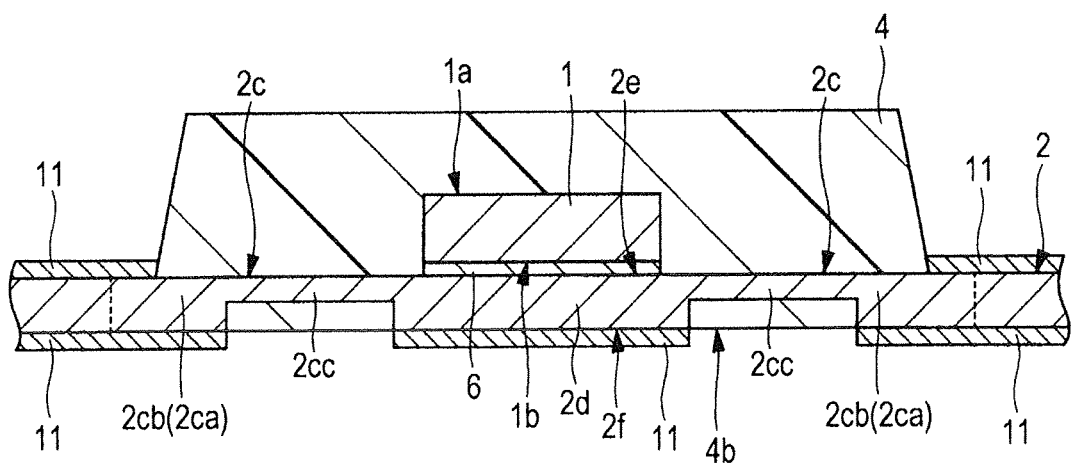
FIG. 25 is a partial cross-sectional view showing one example of the structure after formation of a metallic deposit in the plating step in the fabrication of the semiconductor device of FIG. 1.

FIG. 24 is a partial cross-sectional view showing one example of the structure after formation of a metallic deposit in the plating step in the fabrication of the semiconductor device of FIG. 1; and FIG. 25 is a partial cross-sectional view showing one example of the structure after formation of a metallic deposit in the plating step in the fabrication of the semiconductor device of FIG. 1.

First, a lead frame 2 in the form of a thin sheet and having a plurality of device regions 2j as shown in FIG. 7 is provided. The device region 2j is a region in which a QFN 5 is formed and it has a die pad 2d, a plurality of suspension leads 2c for supporting this die pad 2d, a plurality of leads 2a spaced apart from the die pad 2d and at the same time arranged adjacent to the die pad 2d, a plurality of leads 2b spaced apart from the die pad 2d and at the same time supporting the suspension leads 2c, and a framework 2k supporting the plurality of suspension leads 2c and the leads 2a and 2b. FIG. 7 shows only one device region 2j for convenience sake, but the lead frame 2 has a plurality of the device regions 2j.

Incidentally, in the lead frame 2 of the present embodiment, four leads 2b are coupled to each of four suspension leads 2c at the portion C of the intermediate portion 2ce of the suspension lead 2c or between the portion C and the portion D as shown in FIG. 6. Furthermore, other four short leads 2b are coupled to the suspension lead 2c between the portion C of the intermediate portion 2ce and the portion E of the other end portion 2cf.

Each of the leads 2a of the lead group 2g is longer than each of the leads 2b of the lead group 2h.

Furthermore, in each of the leads 2a and the leads 2b, portions other than those which will be external terminal portions 2i are half etched to a thickness about half of the external terminal portions 2i as shown in FIG. 8.

Similarly, in each of the suspension leads 2c, portions other than those which will be outer portions 2ca and portions other than the die pad 2d are half-etched to a thickness about half of that of the outer portions 2ca or the die pad 2d as shown in FIG. 9.

Then, die bonding is conducted. In the die bonding step, as shown in FIGS. 10 to 12, a semiconductor chip 1 having a front surface 1a, a plurality of bonding pads 1c formed on the front surface 1a, and a rear surface 1b opposite to the front surface 1a is provided. This semiconductor chip 1 is mounted on an upper surface 2e of the die pad 2d such that the rear surface 1b faces to the upper surface 2e of the die pad 2d.

At this time, as shown in FIGS. 11 and 12, the semiconductor chip 1 is mounted on the upper surface 2e of the die pad 2d via a die bonding material 6.

Then, wire bonding is conducted. In the wire bonding step, as shown in FIGS. 13 to 15, a plurality of the bonding pads 1c of the semiconductor chip 1 and a plurality of the leads 2a are electrically connected with each other via a plurality of wires 3, respectively.

First, as shown in FIG. 14, the lead frame 2 having thereon the semiconductor chip 1 is placed on a stage 7a. At this time, the stage 7a has been heated to, for example, about 230° C. Wire bonding is then performed while clamping the outer portion 2ca (not the whole but part) of each of the suspension leads 2c, the outer terminal portion 2i (not the whole but part) of each of the leads 2a, and the outer terminal portion 2i (not the whole but part) of each of the leads 2b with a pressing jig 7b and the stage 7a.

This means that wire bonding is performed while clamping, with the jig 7b and the stage 7a, a peripheral portion of the device region 2j provided in the lead frame 2 (the hatched portion K of FIG. 13) as shown in FIG. 13, which corresponds to a portion (an external terminal portion (thick portion) 2i having a surface exposed from the bottom surface of the sealing body) which will be an external terminal in the lead 2a shown in FIG. 14 and an outer portion (thick portion) 2ca in the suspension lead 2c shown in FIG. 15.

Described specifically, as shown in FIG. 7 and FIGS. 13 to 15, the plurality of leads 2a, the plurality of leads 2b, and the plurality of suspension leads 2c have thickness portions (first thickness portions) 2ab, 2bb, and 2cb and thickness portions (second thickness portions) 2ac, 2bc, and 2cc thinner than the first thickness portions 2ab, 2bb, and 2cb, respectively. Wire bonding is performed while clamping, with the jig 7b and the stage 7a, the thickness portions 2cb of the plurality of suspension leads 2c, the thickness portions 2ab of the plurality of leads 2a, and the thickness portions 2bb of the plurality of leads 2b.

In the wire bonding, as shown in FIG. 14, first, the wire 3 is coupled to the bonding pad 1s of the semiconductor chip 1 by using a capillary 7c. Then, the wire 3 is coupled to the lead 2a to electrically connect the bonding pad 1c of the semiconductor chip 1 with the lead 2a via the wire 3.

Described specifically, the lead frame 2 is placed on the stage 7a heated to, for example, 230° C. and wire bonding is performed while clamping the peripheral portion (the hatched portion K in FIG. 13) of the device region 2j of this lead frame 2. As a result, the lead frame 2 is heated to a high temperature and both the lead 2a and the suspension lead 2c expand in their extending directions and also toward the center portion of the device region 2*j* (the side of the portion opposite to the clamped portion). At this time, the end portion of the lead 2*a* (the portion opposite to the clamped portion) is not linked to the die pad 2*d* and the like so that this lead 2*a* can expand without undergoing distortion. On the other hand, the end portion of the suspension lead 2*c* opposite to the portion clamped by the jig 7*b* is linked to the die pad 2*d* (in addition, another suspension lead 2*c* provided at a position opposite to the above suspension lead via the die pad 2*d* expands toward the side of the die pad 2*d* (center portion of the device region 2*j*)) so that it is likely to undergo distortion.

In the fabrication of the QFN 5 of the present embodiment, however, four leads 2*b* are linked to a portion of the suspension lead 2*c* near the die pad 2*d*, that is, as shown in FIG. 6, the portion C of the intermediate portion 2*ce* of the suspension lead 2*c* or a portion between the portion C and the portion D. These four leads 2*b* support the portion of the suspension lead 2*c* near the die pad 2*d* so that the distortion of the suspension lead 2*c* due to expansion can be suppressed.

Moreover, since the distortion of the suspension lead 2*c* can be suppressed, misalignment of the die pad 2*d* supported by the suspension lead 2*c* in a thickness direction can be suppressed. As a result, wire bonding to the semiconductor chip 1 mounted on the die pad 2*d* can be performed with enhanced bondability.

In addition, at the time of wire bonding, in the plurality of leads 2*b* linked to the suspension lead 2*c*, the thickness portion 2*bb* thereof corresponding to the external terminal portion 2*i* with great thickness is clamped with the jig 7*b* so that the plurality of leads 2*b* can be held firmly and unstable movement or distortion of the suspension lead 2*c* upon wire bonding can be completely suppressed.

After completion of the wire bonding, resin molding is performed. In the molding step, the semiconductor chip 1 and a plurality of wires 3 are sealed with a sealing resin 10 shown in FIG. 19 such that the lower surface 2*f* of the die pad 2*d* opposite to the upper surface 2*e*, the outer portion (not the whole but part) 2*ca* of each of the suspension leads 2*c*, and the outer terminal portion 2*i* (not the whole but part) of each of the plurality of leads 2*a* and 2*b* are exposed, to thereby form the sealing body 4 shown in FIG. 1.

In the molding step, molding is performed using a resin molding die equipped with a pair of a top force (first molding die) 8 and a bottom force (second molding die) 9 as shown in FIGS. 17 and 18. The top force 8 has a cavity portion 8*a* which is a recess for forming the sealing body 4, a gate portion 8*b* serving as an inlet for supplying the resin 10 to the cavity portion 8*a*, an air vent portion serving as a ventilating passage of the cavity portion 8*a*, and the like. Although it is preferred that as shown in FIG. 18, the air vent portion 8*b* is communicated with the cavity portion 8*a* and is formed at least a corner portion opposite to the gate portion 8*b*, it may be formed at the other two corner portions of the cavity portion 8*a*.

Molding is performed in the following manner. First, as shown in FIG. 17, the lead frame having a plurality of wires 3 and the semiconductor chip 1 mounted thereon is placed between the top force 8 having the cavity portion 8*a* and the bottom force 9 opposed to the top force 8 and then, as shown in FIG. 7 and FIGS. 17 and 18, the thickness portion (not the whole but part) 2*cb* of each of the plurality of suspension leads 2*c*, the thickness portion tab (not the whole but part) of each of the plurality of leads 2*a*, and the thickness portion 2*bb* (not the whole but part) of each of the plurality of leads 2*b* are clamped with the top force 8 and the bottom force 9.

This means that molding is performed while clamping, with the top force 8 and the bottom force 9, the peripheral portion (the hatched portion L shown in FIG. 16) of the device region 2*j* of FIG. 7 provided in the lead frame 2, which corresponds to a portion of the lead 2*a* serving as an external terminal (external terminal portion (thickness portion 2*ab*) 2*i*) shown in FIG. 17 and the outer portion (thickness portion) 2*ca* of the suspension lead 2*c* shown in FIG. 18.

In other words, as shown in FIG. 7 and FIGS. 16 to 18, the resin 10 is supplied into the cavity portion (a space portion formed when the top force 8 and the bottom force 9 are clamped) 8*a* while clamping, with the top force 8 and the bottom force 9, the thickness portion 2*cb* of the plurality of suspension leads 2*c* other than the gate portion 8*b* and the air vent portion 8*c*, the thickness portions 2*ab* of each of the plurality of leads 2*a*, and the thickness portion 2*bb* of each of the plurality of leads 2*b*.

Incidentally, the top force 8 and the bottom force 9 are heated to, for example, about 170° C. so that the lead frame 2 clamped with the top force 8 and the bottom force 9 is also under a high-temperature condition.

The position of the lead frame 2 clamped upon molding is the portion L shown in FIG. 16 and it is slightly outside the clamped position (the portion K of FIG. 13) upon wire bonding. This means that wire bonding and molding are both performed while clamping the thickness portion 2*ab* of the lead 2*a*, but they are different in the clamped position. Wire bonding is performed while clamping the thickness portion 2*ab* of the lead 2*a* as close to the bonding position as possible, that is, the thickness portion 2*ab* near the inside in order to enhance the bondability to the lead 2*a*. On the other hand, molding is performed while clamping the thickness portion 2*ab* near the outside, depending on the external dimensions of the QFN 5.

Since the length of the suspension lead 2*c* extending from the clamped position to the center portion of the device region 2*j* is longer at the time of molding than at the time of wire bonding, the suspension lead 2*c* is likely to undergo more distortion at the time of molding when the lead 2*a* and the suspension lead 2*c* expand.

The resin 10 is supplied into the cavity portion 8*a* while clamping and thus, the sealing body 4 is formed.

The supply of the resin 10 into the cavity portion 8*a* is performed via the gate portion 8*b* shown in FIG. 18. As shown in FIG. 19, the resin 10 supplied into the cavity portion 8*a* is diffused in the cavity portion 8*a* as a flow M.

As shown in FIG. 20, the resin 10 is then diffused as a flow N and even the corner portion in the cavity portion 8*a* is filled with it. As shown in FIGS. 21 and 22, the upper portion of the semiconductor chip and the upper portion of each of the leads are also filled with it. Then, the resin 10 as a flow P shown in FIG. 23 fills the corner portion at which the air vent portion 8*c* opposed to the gate portion 8*b* is formed to complete the filling of the cavity portion 8*a*. The filling of the cavity portion 8*a* with the resin 10 is completed while pushing out the air in the cavity portion 8*a* through the air vent portion 8*c*.

In the QFN 5 of the present embodiment, the wire length is reduced so that generation of wire sweep due to the resin 10 can be suppressed in the molding step.

In addition, four leads 2*b* are linked to the position of the long suspension lead 2*c* near the die pad 2*d*, that is, to the suspension lead 2*c* at the portion C of the intermediate portion 2*ce* or at between the portion C and the portion D as shown in FIG. 6. The portion of the suspension lead 2*c* near the die pad 2*d* is supported by these four leads 2*b* so that the distortion of the suspension lead 2*c* due to expansion can be suppressed also in the molding step. In particular, at the time of molding, the thickness portion tab of each of the leads at the outer side is clamped with the top force 8 and the bottom force 9 and the suspension lead 2c extending from the clamped position to the center portion of the device region 2j is longer than that at the time of wire bonding. The suspension lead 2c is therefore likely to undergo distortion. In the present embodiment, since the plurality of leads 2b is linked to the suspension lead 2c at a position thereof on the side of the die pad 2d from the intermediate portion 2ce and thereby supports the suspension lead 2c, the distortion of the suspension lead 2c can be suppressed even in the molding step in which the suspension lead 2c is likely to undergo distortion.

In addition, since the distortion of the suspension lead 2c can be suppressed, the lower surface 2f of the die pad 2d can be exposed completely without being covered with the sealing body 4, leading to improvement in the heat dissipation properties of the QFN 5.

As a result, malfunction of the semiconductor chip 1 can be suppressed and the QFN 5 thus obtained can have improved reliability.

Incidentally, since the plurality of leads 2b are linked to the suspension lead 2c, the suspension lead 2c can be supported with higher strength, making it possible to suppress the distortion of the suspension lead 2c further.

In addition, since the plurality of leads are linked to the suspension lead 2c, variations in the density of the leads 2b in the device region 2j can be reduced, making it possible to stabilize the fluidity (flow rate) of the resin 10 supplied.

In the molding step of the present embodiment, as shown in FIG. 17, molding is performed while placing the lead frame 2 directly on the bottom force 9 without placing a film on the bottom force 9. Alternatively, molding may be performed while laying a film on the bottom force 9 and then placing the lead frame 2 on the film. By molding while placing the lead frame 2 on the film, it is possible to reduce formation of a resin burr on the back surface side of the lead frame 2. When a film is used, it does not matter whether the film has an adhesive material (adhesive layer) or not. When it has an adhesive material, it improves adhesion with the lead frame 2, making it possible to suppress formation of a resin burr further. When the film does not have an adhesive material, on the other hand, it is possible to achieve both cost reduction of the film and suppression of an influence on the bondability in wire bonding.

In the present embodiment, as described above, the long suspension lead 2c tends to easily expand and undergo distortion due to clamping of the lead frame 2 and application of heat in the wire bonding step and molding step so that it is very effective to take the measure of the present embodiment to support, with the plurality of leads 2b, the long suspension lead 2c at the intermediate portion 2ce or at between the intermediate portion 2ce and a position near the die pad 2d. Even when the lead frame 2 is only clamped without application of heat, the suspension lead 2c, when the suspension lead 2c is long, undergoes distortion and causes misalignment of the die pad 2d. It is therefore effective to support, with the plurality of leads 2b, the suspension lead 2c at the intermediate portion 2ce or at between the intermediate portion 2ce and a position near the die pad 2d according to the present embodiment even when the lead frame 2 is only clamped.

The lead frame 2 used in the present embodiment is a plate composed of, for example, a copper (Cu) alloy, but it may be a plate composed of an iron (Fe)-based alloy other than copper alloy. The expansion coefficient of copper is greater than that of iron so that it is more effective to support, with the plurality of leads 2b, the suspension lead 2c at the intermediate portion 2ce thereof or at between the intermediate portion 2ce and a position near the die pad 2d according to the present embodiment when the lead frame 2 is composed of a copper alloy is used.

After completion of molding, a plating treatment in the plating step is performed. As shown in FIGS. 24 and 25, a metallic deposit 11 is formed on the die pad 2d or lead portions exposed from the sealing body 4.

Described specifically, the metallic deposit 11 (for example, deposit formed by solder plating) for exterior is formed on the lower surface 2f of the die pad 2d, the external terminal portions 2i of the leads 2a and the leads 2b, and the outer portions 2ca of the suspension leads 2c, each exposed from the bottom surface 4b of the sealing body 4.

Then, a mark is made in the marking step. In this step, predetermined marks including control number are made on the surface of the sealing body 4 by using laser or the like.

After the marking step, lead is cut in the cutting step, by which the fabrication of the QFN (semiconductor device) 5 is completed. In the cutting step, the plurality of suspension leads 2c and the plurality of leads 2a and 2b exposed from the sealing body 4 are cut to obtain individual packages.

Next, some modification examples of the present embodiment will be described.

Figure 26:
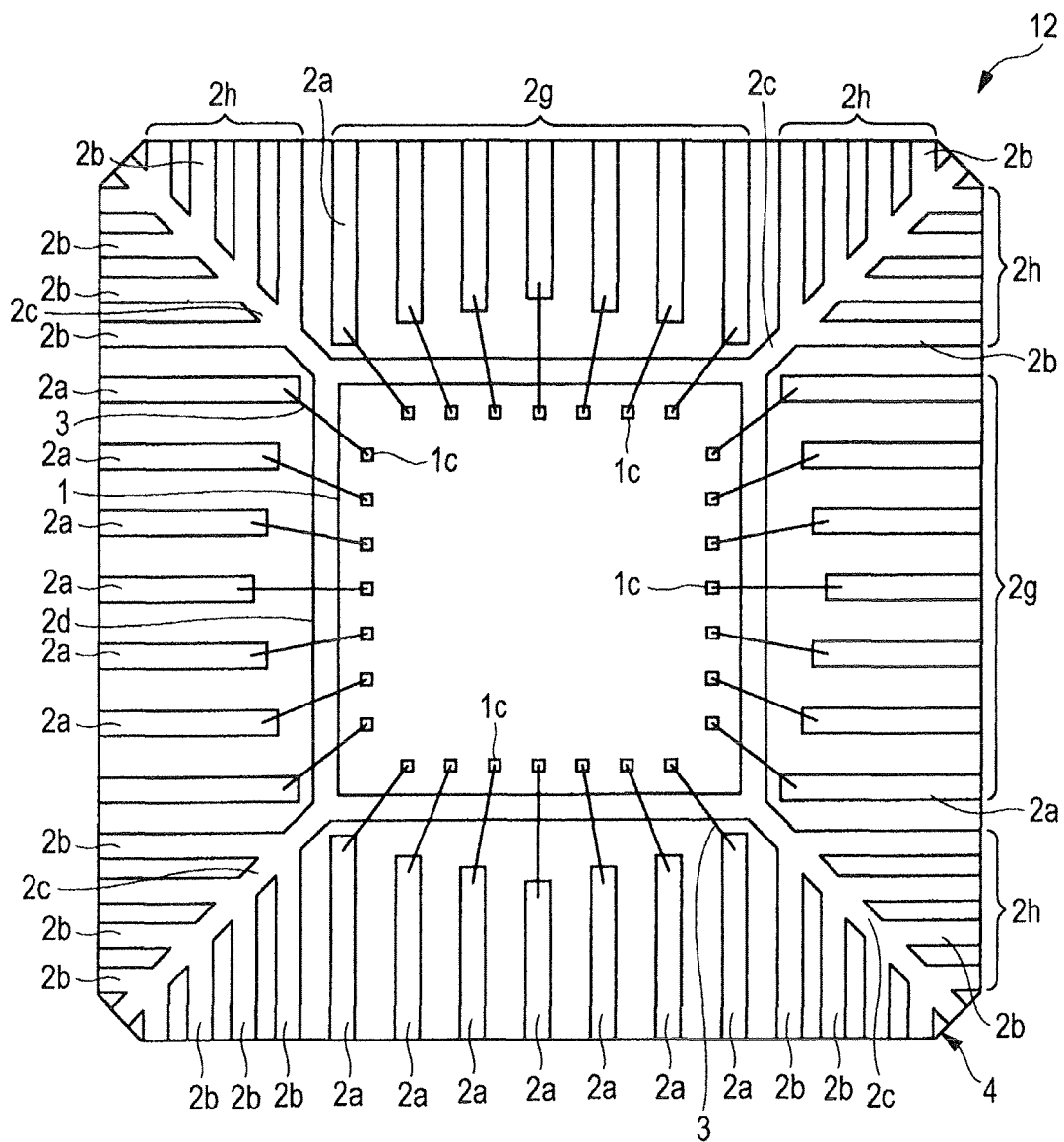
FIG. 26 is a plan view showing, through a sealing body, the structure of a semiconductor device of Modification Example 1 according to the embodiment of the invention.
Figure 27:
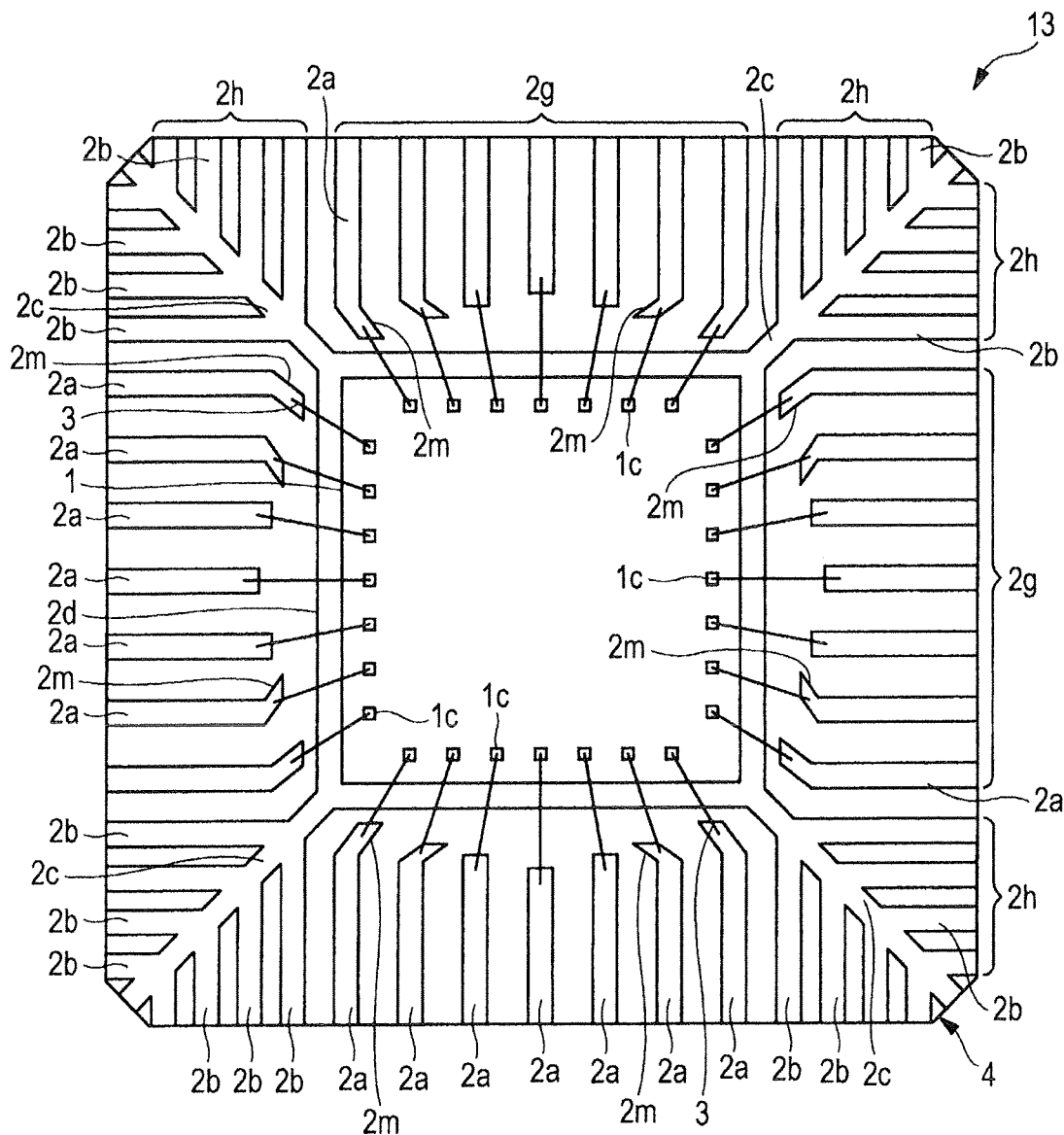
FIG. 27 is a plan view showing, through a sealing body, the structure of a semiconductor device which is Modification Example 2 according to the embodiment of the invention.
Figure 28:
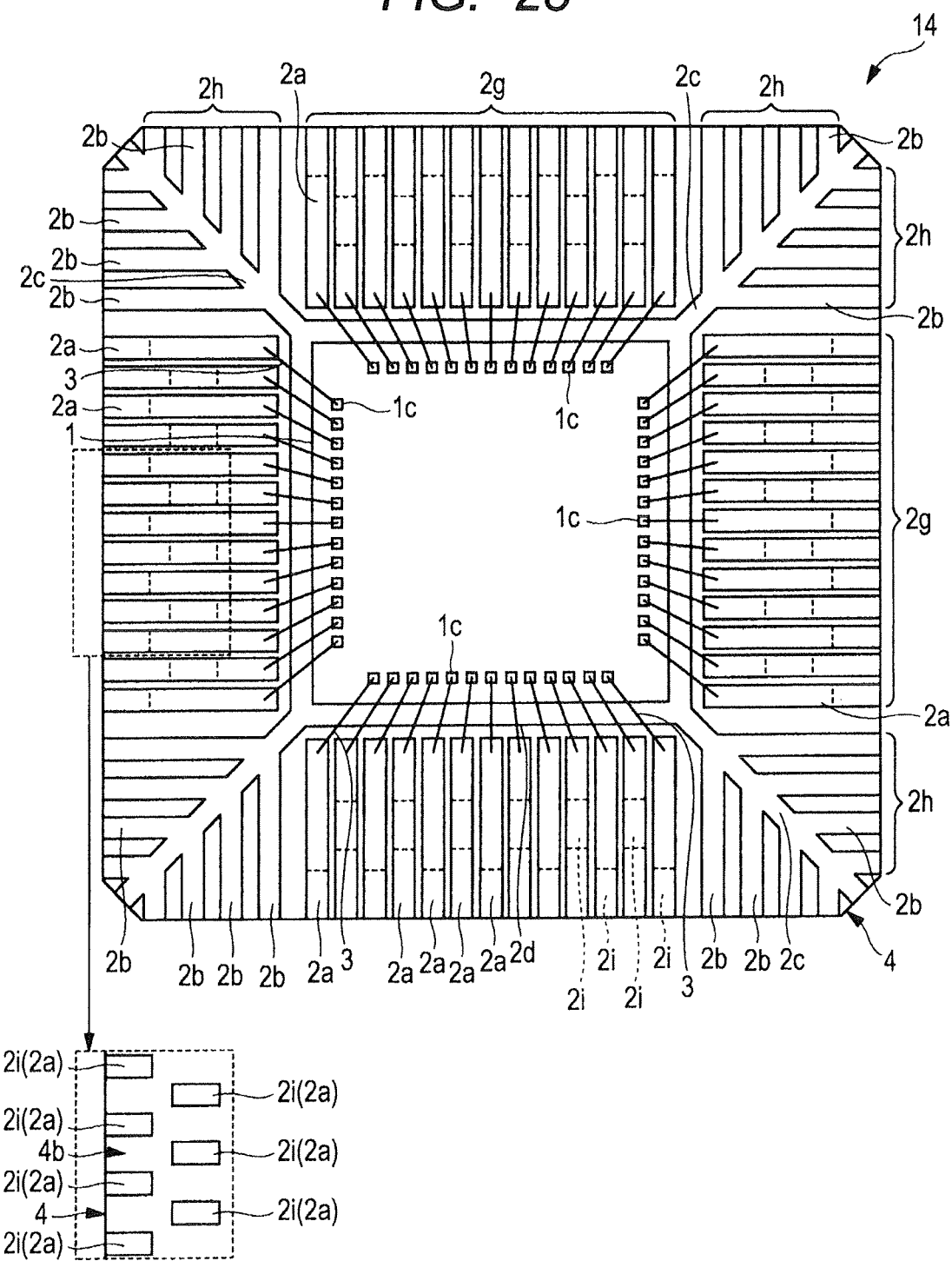
FIG. 28 includes a plan view and a partial back surface view showing, through a sealing body, the structure of a semiconductor device which is Modification Example 3 according to the embodiment of the invention.
Figure 29:
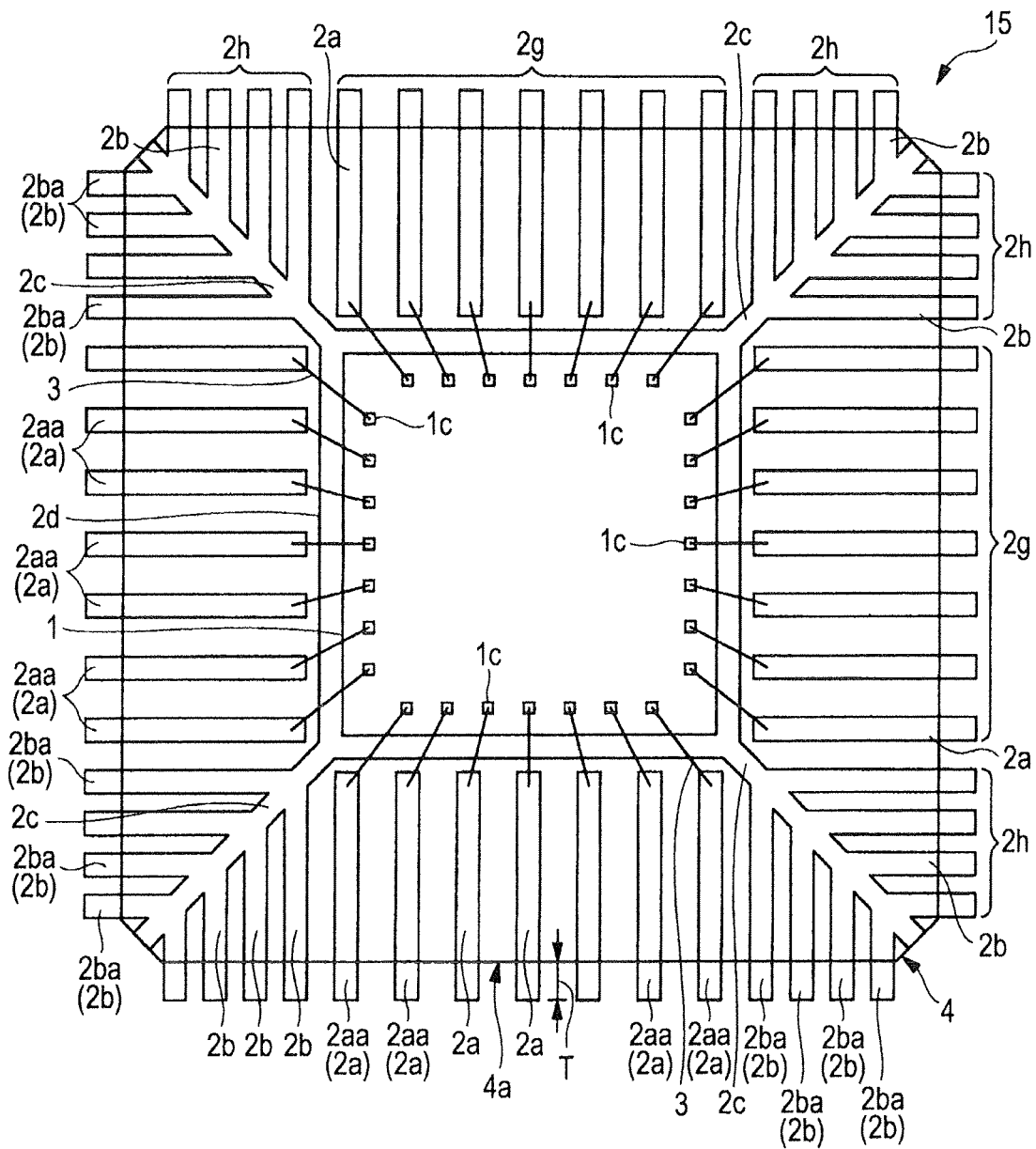
FIG. 29 is a plan view showing, through a sealing body, the structure of a semiconductor device which is Modification Example 4 according to the embodiment of the present invention.
Figure 30:
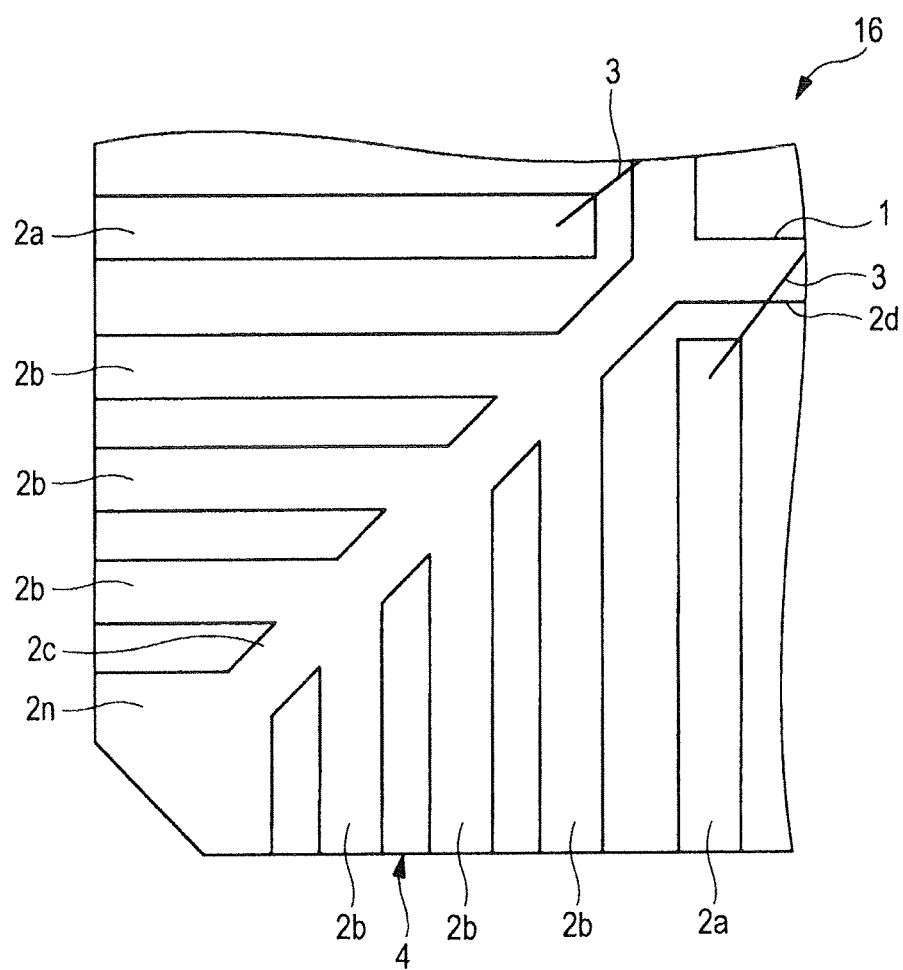
FIG. 30 is an enlarged partial plan view showing, through a sealing body, the structure of a semiconductor device of Modification Example 5 according to the embodiment of the invention.
Figure 31:
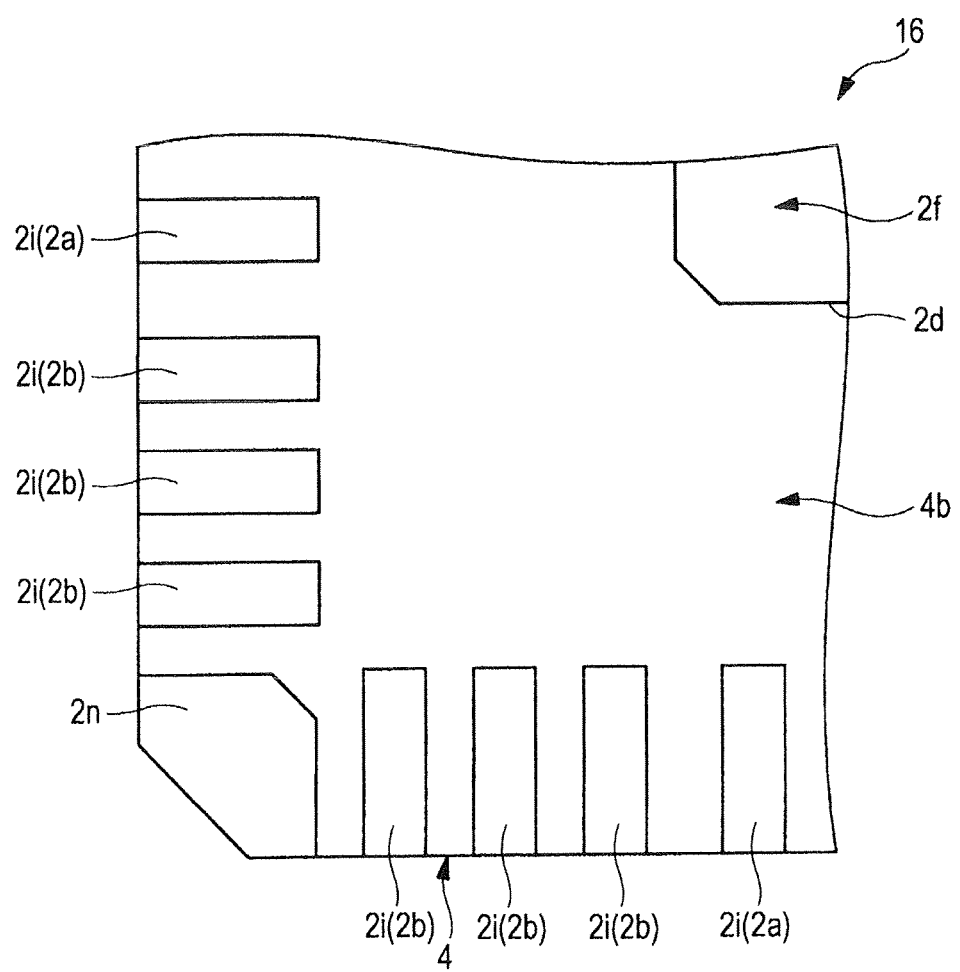
FIG. 31 is an enlarged partial back-surface view showing the structure of the semiconductor device of FIG. 30.
Figure 32:
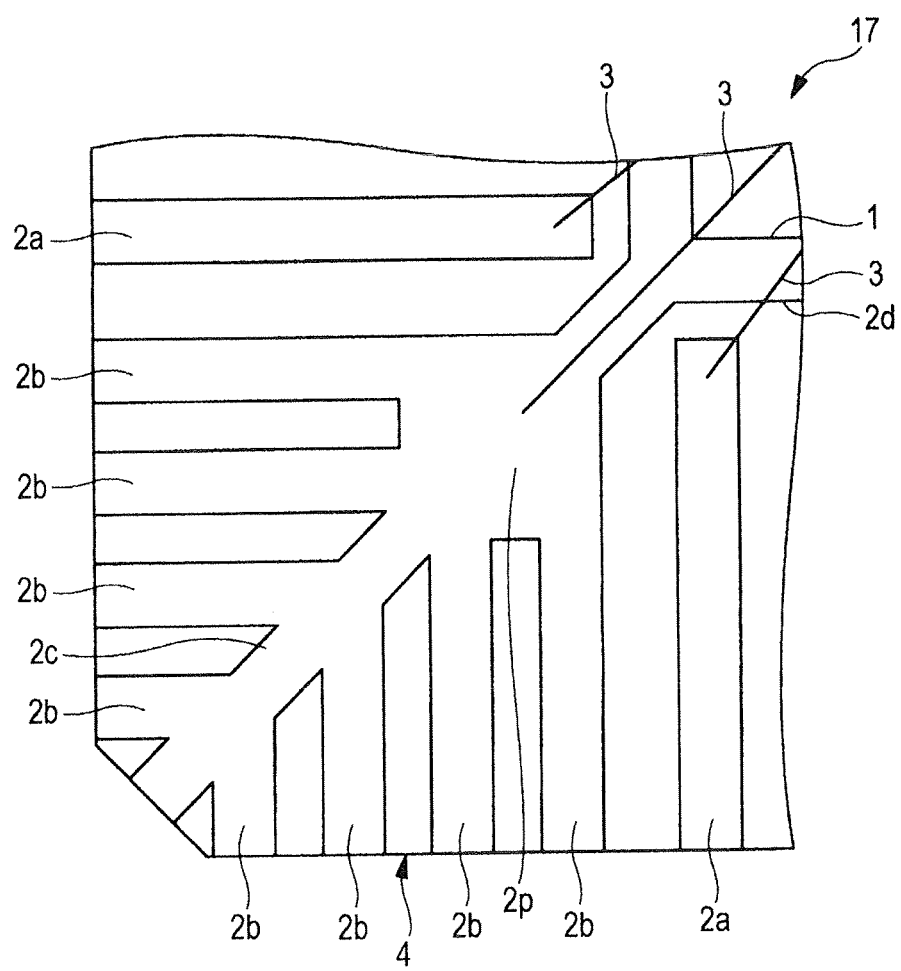
FIG. 32 is an enlarged partial plan view showing, through a sealing body, the structure of a semiconductor device of Modification Example 6 according to the embodiment of the invention.
Figure 33:
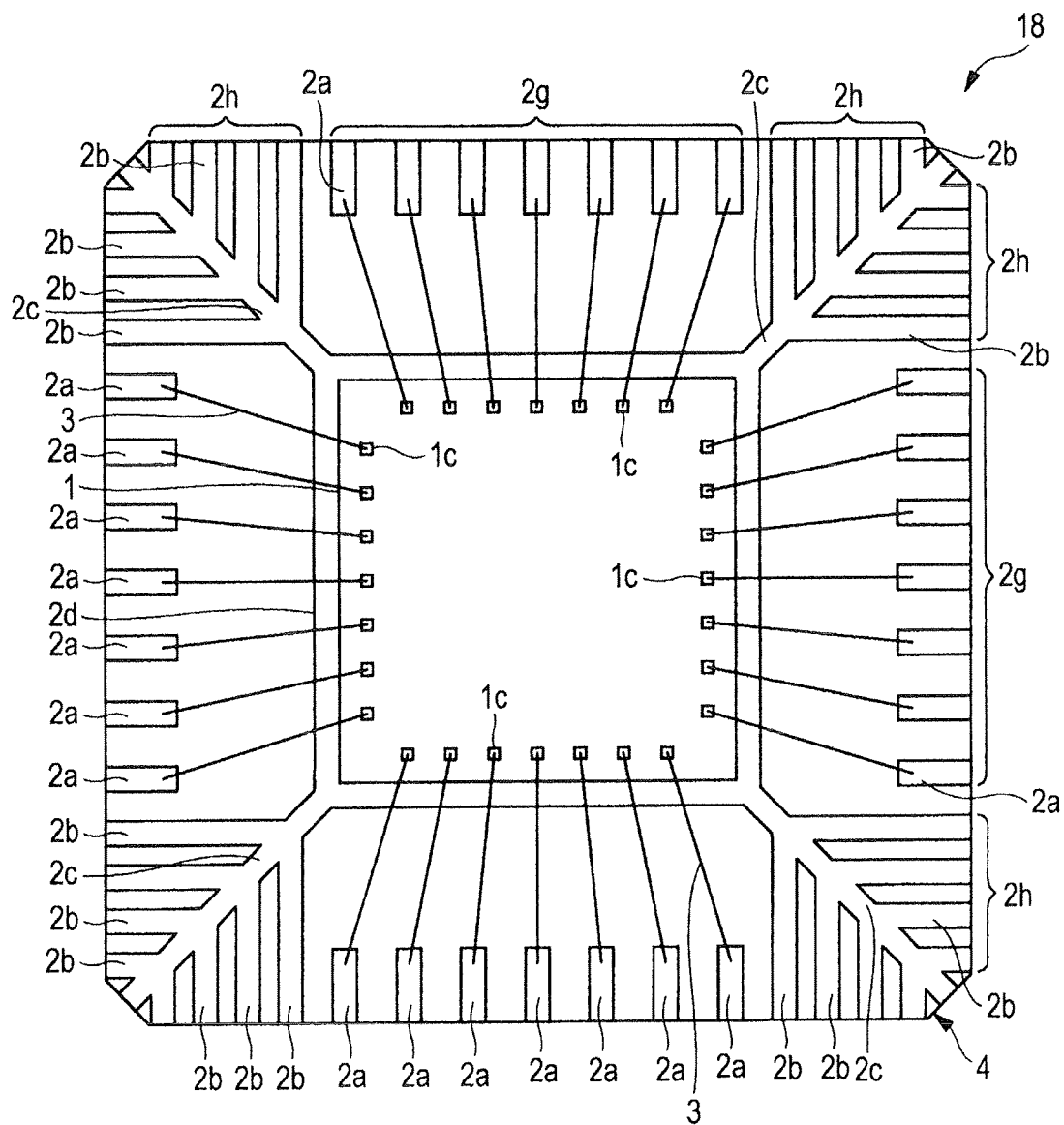
FIG. 33 is a plan view showing, through a sealing body, the structure of a semiconductor device of Modification Example 7 according to the embodiment of the invention.
Figure 34:
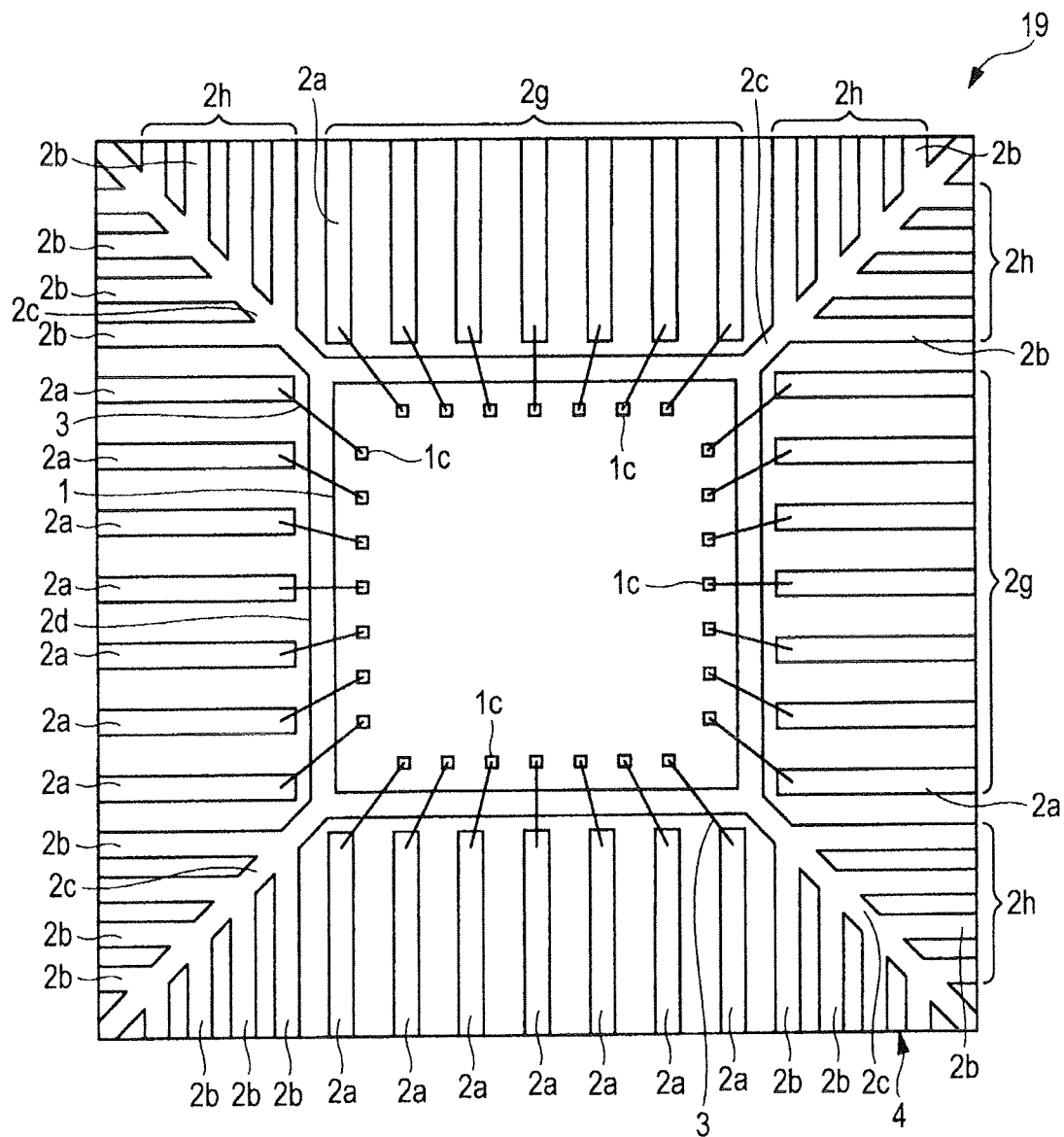
FIG. 34 is a plan view showing, through a sealing body, the structure of a semiconductor device of Modification Example 8 according to the embodiment of the invention.

FIGS. 26 and 27 are plan views showing, through a sealing body, the structures of semiconductor devices of Modification Example 1 and Modification Example 2 according to the embodiment of the invention, respectively; FIG. 28 includes a plan view and a partial back-surface view showing, through a sealing body, the structure of a semiconductor device of Modification Example 3 according to the embodiment of the invention; FIG. 29 is a plan view showing, through a sealing body, the structure of a semiconductor device of Modification Example 4 according to the embodiment of the present invention; FIG. 30 is an enlarged partial plan view showing, through a sealing body, the structure of a semiconductor device of Modification Example 5 according to the embodiment of the invention; FIG. 31 is an enlarged partial back-surface view showing the structure of the semiconductor device of FIG. 30. Furthermore, FIG. 32 is an enlarged partial plan view showing, through a sealing body, the structure of a semiconductor device of Modification Example 6 according to the embodiment of the invention; FIG. 33 is a plan view showing, through a sealing body, the structure of a semiconductor device of Modification Example 7 according to the embodiment of the invention; and FIG. 34 is a plan view showing, through a sealing body, the structure of a semiconductor device of Modification Example 8 according to the embodiment of the invention.

The semiconductor device of Modification Example 1 shown in FIG. 26 is a QFN 12 having a structure similar to that of the QFN 5 of FIG. 1, but is different from the QFN 5 in that the leads 2a of the lead group 2g have various lengths. The lengths of the leads 2a at each of four sides of the sealing body 4 gradually decrease at positions closer to the center of the arrangement of these leads 2a. This means that among the leads 2a arranged along one of the four sides of the sealing body 4, the leads 2a arranged on the sides closest to the leads 2b (or on the sides of the suspension lead 2c), that is, the leads arranged at both ends, are longer than the other leads 2a.

This structure is employed in order to suppress variations in the impedance component of the wires 3 to be connected to the bonding pads 1c, respectively, by equalizing the distance between the bonding pads is and leads 2a or 2b corresponding thereto.

In this QFN 12, among the leads 2a arranged along one of the four sides of the sealing body 4, the leads 2a arranged on the sides closest to the lead 2b, that is, the leads at both ends, are longer than the leads 2b of the lead group 2h, which contributes to a reduction in the wire length.

Incidentally, the QFN 12 of Modification Example 1 has a structure similar to that of the QFN 5 shown in FIG. 6. Described specifically, a portion of each of the plurality of suspension leads 2c is supported at the intermediate portion 2ce of the suspension lead 2c or at between the intermediate portion 2ce and a position near the die pad 2d by the plurality of leads 2b and this structure enables suppression of distortion of each of the plurality of suspension leads 2c.

Another advantage available from the QFN 12 is similar to that available from the QFN 5.

Next, the semiconductor device of Modification Example 2 shown in FIG. 27 is a QFN 13 having a structure similar to that of the QFN 12 of Modification Example 1 described above. It is also a semiconductor device having a structure in which the length of the wires 3 has been equalized, but is different from the QFN 12 in that among the plurality of leads 2a, the leads 2a arranged on the side of the suspension leads 2c have at the end thereof a bent portion 2m, which is a portion bent toward the center of the arrangement of the plurality of leads 2a.

In other words, among the plurality of leads arranged along one of the four sides of the sealing body 4, one or more leads 2a arranged on the side of the suspension lead 2c rather than on the center portion are bent at the end portion thereof toward the die pad 2d. This means that with regard to the leads 2a whose extending direction crosses with the extending direction of the wire 3 at a large angle, the bending direction of the end of the lead 2a and the extending direction of the wire 3 are aligned. This makes it possible to improve the bondability between the wire 3 and the lead 2a.

Another advantage available from the QFN 13 is the same as that available from the QFN 12.

Next, the semiconductor device of Modification Example 3 shown in FIG. 28 is a QFN 14 having a structure similar to that of the QFN 5 shown in FIG. 1, but is different from the QFN 5 in that the leads 2a exposed from the bottom surface 4b of the sealing body 4 among the plurality of leads 2a have respective external terminal portions 2i arranged in a zigzag manner.

By arranging a plurality of external terminal portions 2i of the plurality of leads 2a exposed from the bottom surface 4b of the sealing body in a zigzag manner, the number of terminals can be increased provided that the size of the QFN itself is not changed or the size, in a plan view, of the QFN itself can be reduced provided that the number of the terminals is not changed.

Alternatively, a portion of each of the leads 2a other than the external terminal portion 2i exposed from the sealing body 4 may be narrowed. This makes it possible to increase the distance between leads adjacent to each other.

Another advantage available from the QFN 14 is similar to that from the QFN 5.

Next, the semiconductor device of Modification Example 4 shown in FIG. 29 is a QFN 15 having a structure similar to that of the QFN 5 shown in FIG. 1, but it is different from the QFN 5 in that the respective outer portions 2aa and 2ba of the plurality of leads 2a and 2b protrude from the side surface 4a of the sealing body 4.

More specifically, each of the plurality of leads 2a and the plurality of leads 2b is exposed from the bottom surface 4b (refer to FIG. 2) of the sealing body 4 and at the same time, a portion of each of the leads 2a and 2b protrudes (sticks out) from the side surface 4a of the sealing body 4. Moreover, at the respective protruded portions of the leads 2a and 2b, no sealing body 4 is formed between the leads adjacent to each other.

Since the respective outer portions 2aa and 2ba of the leads 2a and 2b protrude from the side surface 4a of the sealing body 4 and no sealing body 4 is formed between the protruded portions of the leads adjacent to each other, the formation area of a solder fillet (a solder wicking portion) can be increased to heighten the mounting strength of the QFN 15 when the QFN 15 is mounted by soldering on a mounting substrate or the like.

The QFN 15 is defined as follows. Respective outer portions 2aa and 2ba of the plurality of leads 2a and 2b protrude from the side surface 4a of the sealing body 4 and no sealing body 4 is formed between the respective protruded portions of the leads 2a and 2b adjacent to each other. The protruded length (stick-out length) of each of the leads 2a and 2b from the side surface 4a of the sealing body 4 may be at least 0.1 mm or greater.

The protruded length is ideally 0.3 mm≤T≤0.5 mm. The lower limit, 0.3 mm, corresponds to the length (length of the side of the QFN along the extending direction of the lead) of the lead mounted surface (surface exposed from the bottom surface of the sealing body) of the QFN and this length of the lead on the mounted surface is based on the JEITA (Japan Electronics and Information Technology Industries Association) standards. The upper limit, on the other hand, is set at less than ½ (0.5 mm) of the length (1 mm in the JEITA standards) of the protruded length (including the bent portion of the outer lead) of the lead in the QFP in consideration that the QFN 15 is a semiconductor device (package) smaller than the QFP (Quad Flat Package).

Another advantage available from the QFN 15 is similar to that from the QFN 5.

Next, the semiconductor device of Modification Example 5 shown in FIGS. 30 and 31 is a QFN 16 having a structure similar to that of the QFN 5 shown in FIG. 1, but is different from the QFN 5 in that a portion of the suspension lead 2c is exposed from the bottom surface 4b of the sealing body 4 as shown in FIG. 31 and at the same time, the width of the exposed portion is greater than the width of a portion of the suspension lead 2c other than the exposed portion as shown in FIG. 30.

More specifically, a heat dissipating fin 2n having a width greater than that of a portion of the suspension lead 2c other than the exposed portion is formed at a position (portion) of the suspension lead 2c corresponding to the corner portion of the sealing body 4. The fin 2n is exposed from the bottom surface 4b of the sealing body 4 as shown in FIG. 31 and at the same time, the width of the exposed portion is wider than the width of the unexposed portion.

This enhances the heat dissipation properties of the QFN 16 further.

Another advantage available from the QFN 16 is similar to that available from the QFN 5.

The fin 2n may be protruded from the corner portion of the sealing body 4.

The semiconductor device of Modification Example 6 shown in FIG. 32 is a QFN 17 having a structure similar to that of the QFN 5 shown in FIG. 1, but it is different from the QFN 5 in that a wire 3 is electrically connected with the suspension lead 2c.

According to the above description on the QFN 5 shown in FIG. 1, the wire 3 is coupled to none of the suspension lead 2c, the plurality of leads 2b, and the die pad 2d. When a reference potential is reinforced, on the other hand, a wire 3 may be coupled to the suspension lead 2c or the plurality of leads 2b, or moreover to the die pad 2d. When, as described above, the wire 3 is coupled to the suspension lead 2c, the plurality of leads 2b, or the die pad 2d, a bonding area 2p may be formed in advance in a portion of the suspension lead 2c as the QFN 37 shown in FIG. 32 and the wire 3 may be coupled to this bonding area 2p.

Another advantage available from the QFN 17 is similar to that available from the QFN 5.

The semiconductor device of Modification Example 7 shown in FIG. 33 is a QFN 18 having a structure similar to that of the QFN 5 of FIG. 1 but it is different from the QFN 5 in that each of the leads 2a is short.

This means that the semiconductor device has a QFN structure in which each of the plurality of leads 2a is short.

In the suspension lead 2c and the plurality of leads 2b, however, the QFN 18 has a structure similar to that shown in FIG. 6. More specifically, each of the plurality of suspension leads 2c is supported, by the plurality of leads 2b, at the intermediate portion 2ce of the suspension lead 2c or at between the intermediate portion 2ce and a position of the suspension lead near the die pad 2d. This makes it possible to suppress distortion of each of the suspension leads 2c also in the QFN 18.

Incidentally, another advantage available from the QFN 18 is similar to that available from the QFN 5.

Next, the semiconductor device of Modification Example 8 shown in FIG. 34 is a QFN 19 having a structure similar to that of the QFN 5 shown in FIG. 1. It is however different from the QFN 5 in that the suspension lead 2c is branched at the corner portion of the sealing body 4. This means that each of the plurality of suspension leads 2c is branched at the corner portion of the sealing body 4 and is not exposed from the corner portion of the sealing body 4.

A lead frame to be used for the fabrication of the QFN 19 has a plurality of device regions 2j. In the molding step, a resin is supplied into a cavity portion while covering the plurality of device regions 2j with one cavity portion. The plurality of device regions 2j is sealed en bloc.

Since each of the plurality of suspension leads 2c is not exposed from the corner portion of the sealing body 4, occurrence of a package crack at the corner portion of the sealing body 4 can be prevented upon lead cutting.

Furthermore, the QFN 19 is also similar to that shown in FIG. 6 in the structures of the suspension lead 2c and the plurality of leads 2b. It is therefore possible to suppress the distortion of each of the plurality of suspension leads 2c also in the QFN 19.

Another advantage available from the QFN 19 is similar to that available from the QFN 5.

The inventions made by the present inventors have been described specifically based on some embodiments. It should however be borne in mind that the invention is not limited by these embodiments but can be changed without departing from the gist of the invention.

For example, in the above embodiments, each of the plurality of suspension leads 2c of each of QFNs is supported by four leads 2b at the intermediate portion 2ce of the suspension lead 2c or at between the intermediate portion 2ce and a position of the suspension lead near the die pad 2d. At least one of the leads 2b, among the plurality of leads 2b, may be linked (coupled) to each of the plurality of suspension leads 2c at the intermediate portion of the suspension lead 2c or at between the intermediate portion 2ce and a position of the suspension lead near the die pad 2d. Also in this case, it is possible to suppress the distortion of suspension lead 2c.

The invention can be applied to semiconductor devices fabricated using a lead frame.

What is claimed is:

1. A method of manufacturing a semiconductor device comprising the steps of:

(a) providing a lead frame having a die pad, a plurality of suspension leads supporting the die pad, a plurality of first leads spaced apart from the die pad and arranged adjacent to the die pad, and a plurality of second leads spaced apart from the die pad and supporting the suspension leads;

(b) after the step (a), mounting, over an upper surface of the die pad, a semiconductor chip having a front surface, a plurality of bonding pads formed over the front surface, and a rear surface opposite to the front surface such that the rear surface faces to the upper surface of the die pad;

(c) after the step (b), electrically connecting the bonding pads with the first leads via a plurality of wires, respectively; and (d) after the step (c), placing the lead frame having the semiconductor chip thereon between a first molding die having a recessed portion and a second molding die faces to the first molding die, clamping a portion of each of the suspension leads, a portion of each of the first leads, and a portion of each of the second leads with the first molding die and the second molding die, supplying a resin into the recessed portion so as to seal the semiconductor chip and the wires with the resin such that a lower surface of the die pad opposite to the upper surface, the portion of each of the suspension leads, the portion of each of the first leads and the portion of each of the second leads are exposed, and thereby forming a sealing body, wherein a shape in a plan view of the sealing body is comprised of quadrangle;

wherein the suspension leads extend from the die pad to a plurality of corner portions of the sealing body, in the plan view;

wherein each of the suspension leads has one end portion connected to the die pad, the other end portion opposite to the one end portion, and an intermediate portion located between the one end portion and the other end portion, and wherein some of the second leads are connected at the intermediate portion of each of the suspension leads, or at the die pad side of each of the suspension leads from the intermediate portion.

2. The method of manufacturing a semiconductor device according to claim 1, wherein each of the first leads of a first lead group having the first leads is longer than each of the second leads of a second lead group having the second leads.

3. The method of manufacturing a semiconductor device according to claim 2, wherein the first leads of the first lead group differ in length and the first lead, in the first lead group, on the side closest to the suspension lead is longer than each of the second leads of the second lead group.

4. The method of manufacturing a semiconductor device according to claim 1, wherein the wire is not coupled to each of the second leads of the second lead group.

5. The method of manufacturing a semiconductor device according to claim 1, wherein the wire is coupled to some of the second leads of the second lead group.

6. The method of manufacturing a semiconductor device according to claim 1, wherein the suspension lead extends to the corner portion of the sealing body and a portion of the suspension lead is exposed from the bottom surface of the sealing body.

7. The method of manufacturing a semiconductor device according to claim 1, wherein the suspension lead extends to the corner portion of the sealing body, a portion of the suspension lead is exposed from the bottom surface of the sealing body, and the exposed portion of the suspension lead is wider than the other portion of the suspension lead.

8. The method of manufacturing a semiconductor device according to claim 1, wherein the suspension lead is branched at the corner portion of the sealing body.

9. The method of manufacturing a semiconductor device according to claim 1, wherein the respective external terminal portions of the first leads exposed from the bottom surface of the sealing body are arranged in a zigzag manner.

10. The method of manufacturing a semiconductor device according to claim 1, wherein the outer portion of each if the first leads and the second leads protrudes from the side surface of the sealing body.

11. The method of manufacturing a semiconductor device according to claim 1,
   wherein the suspension leads, the first leads, and the second leads each has a first thickness portion and a second thickness portion thinner than the first thickness portion, and
   wherein the resin is supplied into the recessed portion while clamping, with the first metal mold and the second metal mold, the first thickness portion of each of the suspension leads, the first thickness portion of each of the first leads, and the first thickness portion of each of the second leads.

12. A method of manufacturing a semiconductor device comprising the steps of:
   (a) providing a lead frame having a die pad, a plurality of suspension leads supporting the die pad, a plurality of first leads spaced apart from the die pad and arranged adjacent to the die pad, and a plurality of second leads spaced apart from the die pad and supporting the suspension leads;
   (b) after the step (a), mounting, over an upper surface of the die pad, a semiconductor chip having a front surface, a plurality of bonding pads formed over the front surface, and a rear surface opposite to the front surface such that the rear surface faces to the upper surface of the die pad;
   (c) after the step (b), placing the lead frame having the semiconductor chip thereon over a stage, clamping a portion of each of the suspension leads, a portion of each of the first leads, and a portion of each of the second leads with a jig and the stage, and electrically connecting the bonding pads with the first leads via a plurality of wires, respectively; and
   (d) after the step (c), sealing the semiconductor chip and the wires with a resin such that a lower surface of the die pad opposite to the upper surface, the portion of each of the suspension leads, the portion of each of the first leads, and the portion of each of the second leads are exposed, and thereby forming a sealing body,
   wherein a shape in plan view of the sealing body is comprised of quadrangle,
   wherein the suspension leads extend from the die pad to a plurality of corner portions of the sealing body, in the plan view,
   wherein each of the suspension leads has one end portion connected to the die pad, the other end portion opposite to the one end portion, and an intermediate portion located between the one end portion and the other end portion, and
   wherein some of the second leads are connected at the intermediate portion of each of the suspension leads, or at the die pad side of each of the suspension leads from the intermediate portion.

13. The method of manufacturing a semiconductor device according to claim 12, wherein each of the first leads of a first lead group having the first leads is longer than each of the second leads of a second lead group having the second leads.

14. The method of manufacturing a semiconductor device according to claim 12, wherein the suspension lead extends to the corner portion of the sealing body and a portion of the suspension lead is exposed from the bottom surface of the sealing body.

15. The method of manufacturing a semiconductor device according to claim 12,
   wherein the suspension leads, the first leads, and the second leads each have a first thickness portion and a second thickness portion thinner than the first thickness portion, and
   wherein in the step (c), the bonding pads and the first leads are electrically connected with each other via a plurality of wires, respectively, while clamping the first thickness portion of each of the suspension leads, the first thickness portion of each of the first leads, and the first thickness portion of each of the second leads with the jig and the stage.

* * * * *